United States Patent
Ofuji et al.

(10) Patent No.: US 8,304,298 B2
(45) Date of Patent: Nov. 6, 2012

(54) INVERTER MANUFACTURING METHOD AND INVERTER

(75) Inventors: Masato Ofuji, Kawasaki (JP); Katsumi Abe, Kawasaki (JP); Ryo Hayashi, Yokohama (JP); Masafumi Sano, Yokohama (JP); Hideya Kumomi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 522 days.

(21) Appl. No.: 12/597,211

(22) PCT Filed: May 15, 2008

(86) PCT No.: PCT/JP2008/059401
§ 371 (c)(1), (2), (4) Date: Oct. 23, 2009

(87) PCT Pub. No.: WO2008/143304
PCT Pub. Date: Nov. 27, 2008

(65) Prior Publication Data
US 2010/0085081 A1  Apr. 8, 2010

(30) Foreign Application Priority Data
May 18, 2007  (JP) ................................. 2007-133039

(51) Int. Cl.
*H01L 21/00* (2006.01)
(52) U.S. Cl. ........................................ 438/149; 326/102
(58) Field of Classification Search .................. 438/149, 438/104, 275, 795; 257/E21.698
See application file for complete search history.

(56) References Cited

U.S. PATENT DOCUMENTS

| | | | |
|---|---|---|---|
| 4,205,330 A | 5/1980 | Klein | 357/23 |
| 4,395,726 A * | 7/1983 | Maeguchi | 257/351 |
| 5,744,823 A * | 4/1998 | Harkin et al. | 257/68 |
| 5,917,225 A * | 6/1999 | Yamazaki et al. | 257/411 |
| 6,777,752 B2 * | 8/2004 | Osanai et al. | 257/350 |
| 6,906,347 B2 * | 6/2005 | Yamazaki et al. | 257/72 |
| 7,411,209 B2 | 8/2008 | Endo et al. | 257/43 |
| 2001/0038127 A1 * | 11/2001 | Yamazaki et al. | 257/359 |
| 2006/0113565 A1 | 6/2006 | Abe et al. | 257/197 |
| 2006/0244107 A1 | 11/2006 | Sugihara et al. | 257/646 |

(Continued)

FOREIGN PATENT DOCUMENTS

EP   0 354 372 A1   2/1990

(Continued)

OTHER PUBLICATIONS

Office Action dated Jan. 2, 2012, issued in counterpart European application No. 08764479.5 (in English).

(Continued)

*Primary Examiner* — Thao P. Le
(74) *Attorney, Agent, or Firm* — Fitzpatrick, Cella, Harper & Scinto

(57) ABSTRACT

To provide an enhancement-depletion (E/D) inverter which can be easily manufactured, in the present invention, a method of manufacturing an inverter which is composed of an oxide semiconductor in which a channel layer includes at least one element selected from In, Ga and Zn formed on a same substrate, the inverter being the E/D inverter having plural thin film transistors, is characterized by comprising the steps of: forming a first transistor and a second transistor, the thicknesses of the channel layers of the first and second transistors being mutually different; and executing heat treatment to at least one of the channel layers of the first and second transistors.

15 Claims, 11 Drawing Sheets

U.S. PATENT DOCUMENTS

| | | | |
|---|---|---|---|
| 2007/0152921 A1* | 7/2007 | Osame | 345/76 |
| 2008/0179597 A1* | 7/2008 | Yamazaki et al. | 257/59 |
| 2009/0065771 A1 | 3/2009 | Iwasaki et al. | 257/43 |
| 2009/0072232 A1 | 3/2009 | Hayashi et al. | 257/43 |
| 2009/0230890 A1* | 9/2009 | Takahara | 315/307 |
| 2009/0242992 A1* | 10/2009 | Kim et al. | 257/360 |
| 2010/0044703 A1 | 2/2010 | Yabuta et al. | 257/43 |
| 2010/0059751 A1 | 3/2010 | Takahashi et al. | 257/43 |
| 2010/0117072 A1 | 5/2010 | Ofuji et al. | 257/43 |
| 2010/0117684 A1* | 5/2010 | Kim et al. | 326/120 |

FOREIGN PATENT DOCUMENTS

| | | |
|---|---|---|
| JP | 2005-072461 A | 3/2005 |
| JP | 2006-165532 A | 6/2006 |

OTHER PUBLICATIONS

H. Yabuta et al., "High-mobility thin-film transistor with amorphous InGaZnO$_4$ channel fabricated by room temperature rf-magnetron sputtering," Applied Physics Letters, vol. 89, 112123 (2006).

M. Ofuji et al., "Fast Thin-Film Transistor Circuits Based on Amorphous Oxide Semiconductor," IEEE Electron Device Letters, vol. 28, No. 4, Apr. 2007.

P. Barquinha et al., "Influence of the semiconductor thickness on the electrical properties of transparent TFTs based on indium zinc oxide," Journal of Non-Crystalline Solids, vol. 352, No. 9-20, pp. 1749-1752 (2006).

N.L. Dehuff et al., "Transparent thin-film transistors with zinc indium oxide channel layer," Journal of Applied Physics, vol. 97, 064505 (2005).

P. Barquinha, et al., "Influence of the semiconductor thickness on the electrical properties of transparent TFTs based on indium zinc oxide", Journal of Non-Crystalline Solids, vol. 352, Nos. 9-20, pp. 1749-1752, Elsevier Publishing, Amsterdam, NL, Apr. 17, 2006.

N.L. Dehuff, et. al., "Transparent thin-film transistors with zinc indium oxide channel layer", Journal of Applied Physics, vol. 97, No. 6, pp. 064505-1-064505-5, Mar. 11, 2005.

Office Action dated May 29, 2012, issued in counterpart Taiwan Patent Application 097117638, with translation.

* cited by examiner

FIG. 5

| β RATIO | MOBILITY RATIO ($\mu$(Dr)/$\mu$(Ld)) | $V_{dd}$(V) | $V_{th}$(V) | \|($V_{th}$(Ld)−$V_{th}$(Dr))/$V_{dd}$\| | | | |
|---|---|---|---|---|---|---|---|
| | | | | 0.7 | 1 | 1.4 | 2 |
| 5 | 1 | 5 | 2 | ▲ | ○ | ○ | × |
| 5 | 1 | 10 | 2 | ▲ | ○ | ○ | × |
| 5 | 1 | 20 | 2 | △ | ○ | ○ | × |
| 5 | 1 | 20 | 0.5 | △ | ○ | ○ | × |
| 5 | 1 | 20 | 2 | △ | ○ | ○ | × |
| 5 | 1 | 20 | 5 | △ | ○ | ○ | ○ |
| 5 | 1 | 20 | 8 | ▲ | ○ | ○ | ○ |
| 5 | 0.3 | 20 | 2 | △ | ○ | – | – |
| 5 | 0.6 | 20 | 2 | △ | ○ | × | × |
| 5 | 1 | 20 | 2 | △ | ○ | ○ | × |
| 10 | 1 | 20 | 2 | △ | ○ | ○ | ○ |
| 5 | 1 | 5 | 2 | ▲ | ○ | ○ | × |
| 5 | 1 | 5 | 4 | – | ● | ● | – |
| 5 | 0.3 | 5 | 2 | ▲ | ○ | – | – |
| 5 | 0.3 | 5 | 4 | – | ● | – | – |

○ HIGHER SPEED AND LARGER AMPLITUDE AS COMPARED WITH E/E
● OPERABLE IN E/D (INOPERABLE IN E/E)
△ LOWER SPEED BUT LARGER AMPLITUDE AS COMPARED WITH E/E
▲ NOISE MARGIN IS NARROW (100μs OR MORE IS NECESSARY FOR STABLE OSCILLATION)
× HIGHER SPEED BUT SMALLER AMPLITUDE AS COMPARED WITH E/E
– NO OSCILLATION IN E/D (OPERABLE IN E/E)

FIG. 6

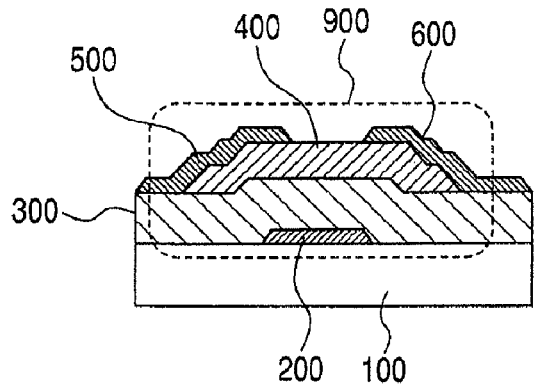

FIG. 13
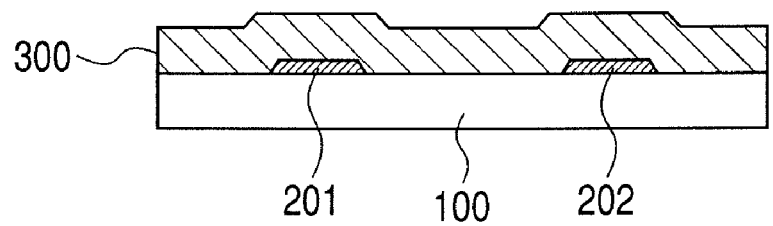
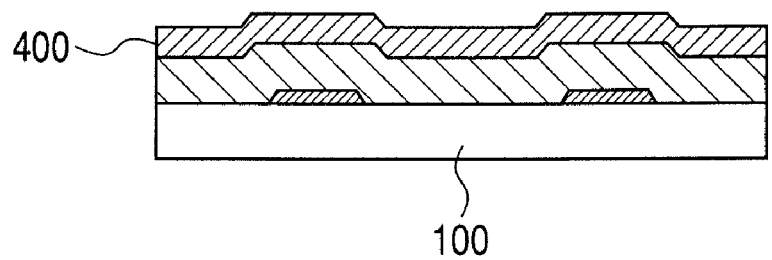
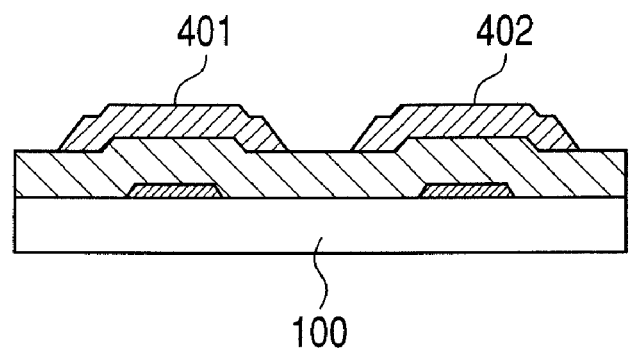
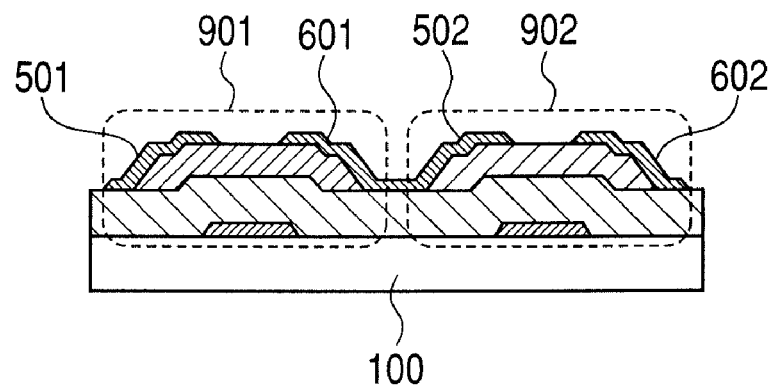

US 8,304,298 B2

INVERTER MANUFACTURING METHOD AND INVERTER

TECHNICAL FIELD

The present invention relates to an inverter which is constituted by a thin film transistor including an oxide semiconductor layer as a channel layer. Moreover, the present invention relates to an integrated circuit which contains the relevant inverter.

BACKGROUND ART

TFT (thin film transistor) backplanes in which TFTs are arranged like an array on the substrates are the backbone parts for various kinds of active matrix displays such as a liquid crystal display, an organic light emitting diode (OLED) display and the like. In the active matrix display, the TFT drives an electro-optic device corresponding to each pixel to display a desired content. As the TFT for such a purpose, a low-temperature polycrystalline silicon (LTPS) TFT, a hydrogenated amorphous silicon (a-Si:H) TFT, and the like are considered.

Further, a technique for simultaneously manufacturing TFTs respectively having different functions on the same substrate as the TFT backplane is considered. More specifically, in this technique, the TFT (pixel circuit) for driving the electro-optic device of each pixel and the peripheral circuits such as a gate driver, a source driver and the like constituted by TFTs are simultaneously manufactured on the same substrate. In this case, since the function of the TFT is different with respect to each of the circuit blocks such as the pixel circuit, the peripheral circuit and the like, it is desirable to adjust the threshold voltage of the TFT for each circuit block. For example, it should be noted that a large threshold voltage suitable for an inverting threshold of the electro-optic device is desired in the pixel circuit, and a small threshold voltage is desired for suppressing power consumption in the peripheral circuit. With this background, Japanese Patent Application Laid-Open No. 2005-072461 discloses a method of adjusting threshold voltages of the TFTs according to pixel blocks in LIPS TFT circuits fabricated using excimer laser annealing (ELA).

The peripheral circuits include digital circuits such as a shift register and the like. Here, it should be noted that, in case of manufacturing the digital circuit by TFTs, the following four constructions (1) to (4) can be employed as a NOT element (inverter): construction (1) is a resistive load, construction (2) is an enhancement-enhancement device (E/E), construction (3) is an enhancement-depletion device (E/D), and construction (4) is a complementary metal-oxide semiconductor (CMOS). Generally, the E/D construction or the CMOS construction is frequently applied with the objective of reducing layout area and achieving high-speed operation. Incidentally, to efficiently operate the E/D inverter, it is necessary to control the threshold voltage of the TFT so as to make the difference between the threshold voltages of the two TFTs constituting the inverter sufficiently large. On the other hand, since both an n-channel TFT and a p-channel TFT are necessary for the CMOS inverter, the respective doping processes for each TFT are required, resulting in a greater number of photolithography processes as compared with other constructions.

Incidentally, as candidates for high-performance TFTs to be used instead of the LIPS TFTs or the a-Si:Hs, TFTs (oxide TFTs) in which oxide semiconductor layers are used as the channel layer have been actively researched and developed.

Here, a manufacturing method of an oxide TFT by using an RF-magnetron sputter thin film of amorphous In—Ga—Zn—O (IGZO) as the channel layer is disclosed in the document "Appl. Phys. Lett. 89, 112123 (2006)". Many kinds of high-mobility oxide semiconductor such as the amorphous IGZO and the like have n-type (electron) conductivity, but do not come to have p-type (hole) conductivity even by doping, whereby the CMOS constitution cannot be used. However, the oxide TFT has the following two advantages. That is, (1) the mobility of the oxide TFT is extremely higher than the mobility of the a-Si:H TFT. For this reason, the document "IEEE Elec. Dev. Lett., 28, p. 273 (2007)"discloses that, even if a saturation load E/E constitution inverter which is inconvenient in the point of an operation speed is used, a high-speed operation which exceeds the a-Si:H TFT inverter can be achieved. Further, (2) sputter-deposition is available for the channel layer. Thus, since a mother glass substrate can be enlarged, the reduction in manufacturing cost according to the enlargement of the substrate can be expected.

Also, various methods of controlling the threshold voltage for the oxide TFT are disclosed in the following documents. First, U.S. Patent Application Publication No. US-2006-0113565 discloses a TFT which includes In, Ga, Zn and O as its constituent elements and uses, as the channel layer, a transparent amorphous oxide thin film of which the electron carrier density is less than $10^{18}\,cm^{-3}$, and an integrated circuit which uses the relevant TFTs. Further, this document mentions a use of a depletion (D) type TFT, but does not mention a concrete method of controlling $V_{th}$ in the TFT.

U.S. Patent Application Publication No. US-2006-0244107 discloses a method of, in a TFT which uses zinc oxide (ZnO) as the channel layer, controlling $V_{th}$ by doping into a channel layer deposition atmosphere.

Further, the document "BAROUINHA ET AL: "Influence of the semiconductor thickness on the electrical properties of transparent TFTs based on indium zinc oxide," JOURNAL OF NON-CRYSTALLINE SOLIDS, NORTH-HOLLAND PHYSICS PUBLISHING. AMSTERDAM, NL, vol. 352, no. 9-20, 15 Jun. 2006 (2006-06-15), pages 1749-1752 XP005482522, ISSN: 0022-3093," at FIG. 3 discloses that, in a TFT which uses ZnO as the material of the channel layer, $V_{th}$ is controlled by the thickness of a deposited channel layer.

Furthermore, the document "Journal of Applied physics, 97, p. 064505 (2005)" discloses that, in a TFT which uses zinc indium oxide (Zn—In—O) as the material of the channel layer, $V_{th}$ is controlled by a heat treatment temperature.

In any case, all of U.S. Patent Application Publication No. US-2006-0244107, the document "Solid State Electronics, 352 (9-20), p. 1749 (2006)" and the document "Journal of Applied physics, 97, p. 064505 (2005)" disclose that the characteristics of the TFTs respectively manufactured on the different substrates in different conditions are mutually different. However, none of these documents disclose a concrete method of manufacturing the TFTs each having different $V_{th}$ are manufactured on the same substrate.

In the method disclosed in Japanese Patent Application Laid-Open No. 2005-072461, it is difficult to inexpensively manufacture a TFT digital circuit due to the following two reasons. First, the TFT disclosed in this document is an LIPS TFT. In other words, since the cost increases because the ELA device itself is enlarged even if the mother glass substrate is enlarged, the advantage of manufacturing cost according to the enlargement of the substrate is small. Second, it is impossible to obtain the E/D inverter that effectively operates, since the difference in the TFT threshold voltages acquired in the method disclosed in this document is too small. For this reason, the inverter disclosed in this document has the CMOS constitution, and the photolithography process is complicated as compared with other constitutions, whereby the cost increases.

DISCLOSURE OF THE INVENTION

The present invention aims to solve the above-described problem. The present invention is characterized by a method of manufacturing an enhancement-depletion (E/D) inverter having plural thin film transistors formed on a same substrate, the channel layers of the said transistors being composed of an oxide semiconductor including at least one element selected from In, Ga and Zn, and the method comprising the steps of: forming a first transistor and a second transistor, thicknesses of the channel layers of the first and second transistors being mutually different; and executing heat treatment to at least one of the channel layers of the first and second transistors.

Further, the present invention is characterized by a method of manufacturing an enhancement-depletion (E/D) inverter having plural thin film transistors formed on a same substrate, the channel layers of the said transistors being composed of an oxide semiconductor including at least one element selected from In, Ga and Zn, and the method comprising the steps of: forming a common deposition film acting as the channel layer of a first transistor and the channel layer of a second transistor; and executing heat treatment by applying more heat to either one of the channel layer of the first transistor and the channel layer of the second transistor.

Furthermore, the present invention is characterized in that, from among plural oxide semiconductor thin film transistors which are formed on a same substrate and each of which includes at least one element selected from In, Ga and Zn, thicknesses of channel layers of at least the two transistors are mutually different, and threshold voltages of the two transistors are mutually different.

According to the present invention, it is possible to relatively easily manufacture the oxide semiconductor thin film transistors respectively having different threshold voltages on the same substrate by using the characteristics of the oxide semiconductor thin film transistor. For example, the relevant characteristics include the characteristic that a difference in the threshold voltages occurs due to a difference in the thicknesses of the channel layers, and the characteristic that a difference in the threshold voltages occurs due to a difference in the heat treatment conditions of the channel layers. Even if either of these two characteristics is used, it is possible to sufficiently enlarge the difference in the threshold voltages, whereby the E/D inverter operates effectively.

Further features of the present invention will become apparent from the following description of the exemplary embodiments with reference to the attached drawings.

BRIEF DESCRIPTION OF THE DRAWINGS

The accompanying drawings, which are incorporated in and constitute a part of the specification, illustrate the embodiments of the invention and, together with the description, serve to explain the principles of the invention.

FIG. 5 is a view indicating an evaluation (simulation) result of the effective fabricating condition of the E/D inverter.
FIG. 6 is a cross sectional view of a fabricated TFT.

FIG. 13 is cross sectional views indicating the fabrication process of the E/D inverter in the Embodiment 3.

BEST MODE FOR CARRYING OUT THE INVENTION

The exemplary embodiments of the present invention will now be described in detail with reference to the accompanying drawings.

Figure 1:
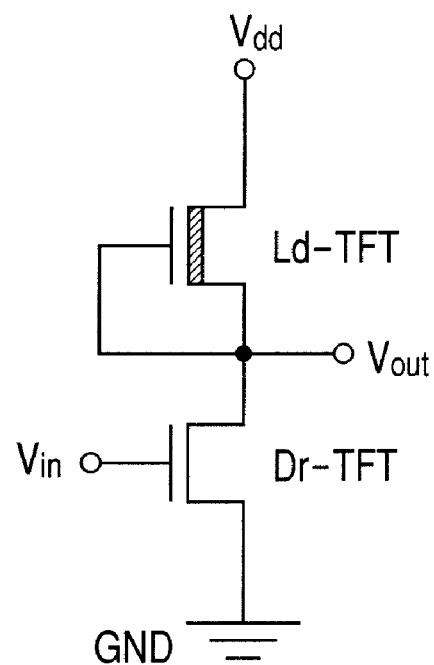
FIG. 1 is a circuit diagram of an E/D inverter.

A circuit diagram of an E/D inverter which can be fabricated by the present invention is indicated in FIG. 1. One piece of enhancement type (E-type) TFT (Thin Film Transistor) and one piece of depletion type (D-type) TFT are used in the E/D inverter. The power supply voltage is supplied from the external as potential difference between $V_{dd}$ and GND. A source electrode of the D-type TFT and a drain electrode of the E-type TFT are connected with each other, and a gate electrode of the D-type TFT is connected with the source electrode of the D-type TFT. A drain electrode of the D-type TFT is connected with the power supply voltage $V_{dd}$ terminal and a source electrode of the E-type TFT is connected to the ground. And, a gate electrode of the E-type TFT is set to serve as an input nodeterminal and the drain electrode of the E-type TFT is set to serve as an output terminal.

In principle, the output voltage of the E/D inverter at a time of the "high" output rises to the voltage equivalent to the power supply voltage. Therefore, the E/D inverter has the feature that amplitude of the output voltage is wide and a rise time of the output voltage is quick.

Figure 2:
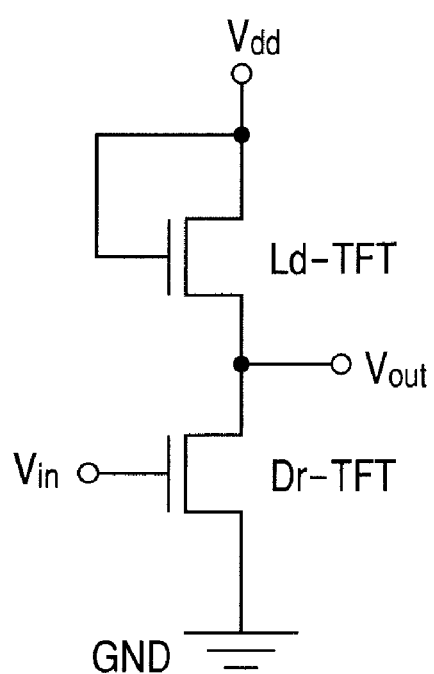
FIG. 2 is a circuit diagram of a saturated load E/E inverter.

On the other hand, a circuit diagram of a saturated load E/E inverter, where both a load TFT and a driver TFT are set to serve as the E-types, is indicated in FIG. 2. Similar to the E/D inverter, the power supply voltage is supplied from the external as potential difference between $V_{dd}$ and GND.

When these two types of inverters are compared with each other, the E/D inverter can drive the load capacity at higher speed with larger amplitude.

In the TFT, when a drain-source voltage ($V_{ds}$) is sufficiently larger than a gate-source voltage ($V_{gs}$), the TFT operates in a saturation region, and a drain-source current ($I_{ds}$) is represented by the following expression.

$$I_{ds}=(W\cdot C_i\cdot \mu/2L)\cdot (V_{gs}-V_{th})^2 \quad (1)$$

Here, reference symbol L denotes channel length (unit: μm), reference symbol W denotes channel width (μm), reference symbol $C_i$ denotes gate insulator capacitance (F/cm$^2$), reference symbol p denotes field effect carrier mobility (cm$^2$/Vs) and reference symbol $V_{th}$ denotes a threshold voltage (V).

Although there are some methods in an experimental obtaining method of μ and $V_{th}$, one of the methods will be described below. In the TFT, a square root of the current $I_{ds}$ during a period, while sweeping the voltage $V_{gs}$ and applying the constant voltage $V_{ds}$ sufficiently larger than the voltage $V_{gs}$, is plotted on a graph as a function of the voltage $V_{gs}$. The μ and $V_{th}$ can be obtained from gradient and intercept of a tangent line drawn at a point of arbitrary voltage $V_{gs}$ on this graph. The tangent line can be also drawn at a point of the voltage $V_{gs}$ where the derivative of the foregoing plot becomes a maximum, or at a point of the voltage $V_{gs}$ actually to be applied to the TFT. From the latter case, it is considered that the effective μ and $V_{th}$ in the vicinity of the voltage $V_{gs}$ can be obtained.

One definition of the E-type and D-type TFTs will be described by exemplifying an n-channel TFT for the sake of simplification. A TFT can be called an enhancement type (E-type) TFT, if its current $I_{ds}$ is sufficiently small at a voltage of $V_{gs}=0$ and therefore can be regarded as being in an OFF state. Inversely, a TFT, which has finite $I_{ds}$ at a voltage of $V_{gs}=0$ in the n-channel TFT, and to which the negative $V_{gs}$ has to be applied as the reverse bias to make the TFT an OFF state, is called a depletion type (D-type) TFT. Equivalently, the E- and D-type TFTs can be defined using the ON (turn-on) voltage ($V_{on}$), which is the voltage $V_{gs}$ where the current $I_{ds}$ starts to increase while the voltage $V_{gs}$ is swept from the value at which time the TFT is in an OFF state. A TFT having the positive voltage $V_{on}$ can be defined as the E-type and a TFT having the negative voltage $V_{on}$ can be defined as the D-type. And, instead of the above-mentioned definition, it can be also defined that a TFT substantially having the positive voltage $V_{th}$ is the E-type and a TFT substantially having the negative voltage $V_{th}$ is the D-type respectively.

Although the above description was given by using the n-channel TFT, similar to the above description, various definitions concerned with the E-type and the D-type can be considered also in a p-channel TFT.

In the following, it is defined that an n-channel TFT basically having the positive voltage $V_{th}$ is the E-type and an n-channel TFT substantially having the negative voltage $V_{th}$ is the D-type. However, also in case of using two n-channel TFTs having the positive voltage, an inverter can be also structured by treating the one side TFT as the D-type not as the E-type when there is large difference between two voltages $V_{th}$.

(First Embodiment)

Figure 3:
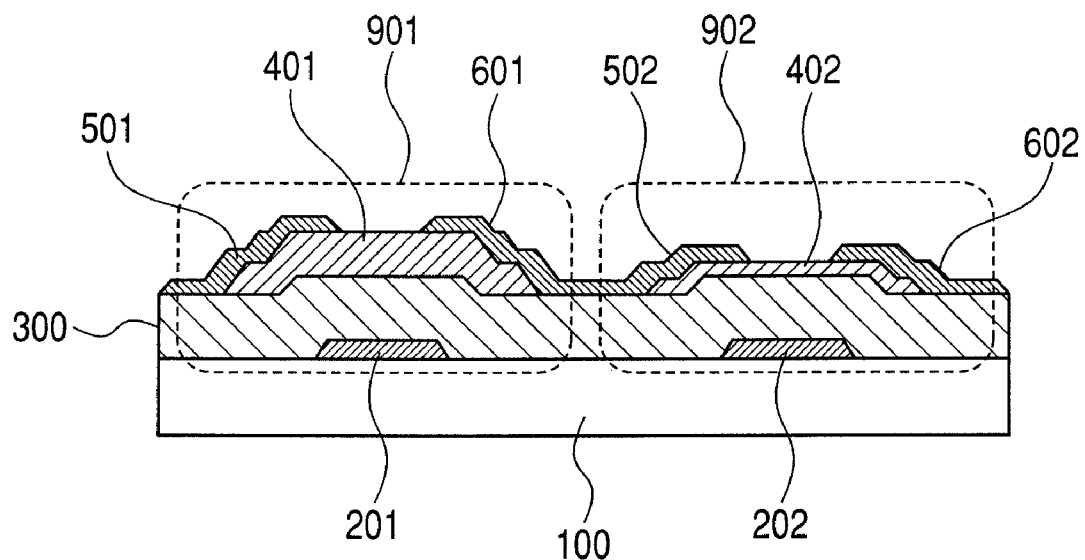
FIG. 3 is a cross sectional view of the first embodiment.

A part of a cross sectional view of an inverter according to the first embodiment of the present invention is indicated in FIG. 3.

A first TFT 901 and a second TFT 902 are fabricated on a substrate 100.

The first TFT 901 includes a first gate electrode 201, an insulator layer 300, a first channel layer 401, a first drain electrode 501 and a first source electrode 601.

The second TFT 902 includes a second gate electrode 202, the insulator layer 300, a second channel layer 402, a second drain electrode 502 and a second source electrode 602.

Here, the insulator layer 300 is integrally built into the first TFT 901 and the second TFT 902. However, it may be separately built into the each TFT.

The first source electrode 601 and the second drain electrode 502 are connected with each other. The first gate electrode 201 is connected with the first source electrode 601 by a wiring (not illustrated).

When the first drain electrode 501 is connected to the power supply voltage $V_{dd}$ terminal and the second source electrode 602 is connected to the ground, an E/D inverter, where the second gate electrode 202 is set to serve as an input node and the second drain electrode 502 is set to serve as an output node, is provided.

That is, a first transistor, which is one transistor, becomes the D-type, and a second transistor, which is the other transistor, operates as the E-type.

The first channel layer 401 is thicker than the second channel layer 402. In this manner, after fabricating the channel layers having different thickness each other, the whole device is collectively processed to apply the heat in an arbitrary fabricating stage. As a result of this process, the first TFT 901 and the second TFT 902 have different values of the $V_{th}$ each other.

In order to adjust thickness of the channel layers 401 and 402, a dry etching process or a wet etching process may be performed after forming a common deposition film consisted of the oxide semiconductor which becomes the channel layers 401 and 402. In this manner, if utilizing the etching process, since formation of the channel layer is achieved by only one time, a manufacturing cost can be reduced.

In addition, a lift-off method can be also utilized. That is, the film thickness can be also controlled by forming the channel layer again upon applying the photoresist on an upper portion of an E-type channel layer after fabricating a channel layer, of which thickness corresponds to that of the E-type channel layer which is the second channel layer 402, on an entire surface. When flushing out the whole structure, the channel layers having two kinds of thickness can be obtained on a substrate. In this case, it is preferable because the film thickness controllability is high every channel layer.

(Second Embodiment)

Figure 4:
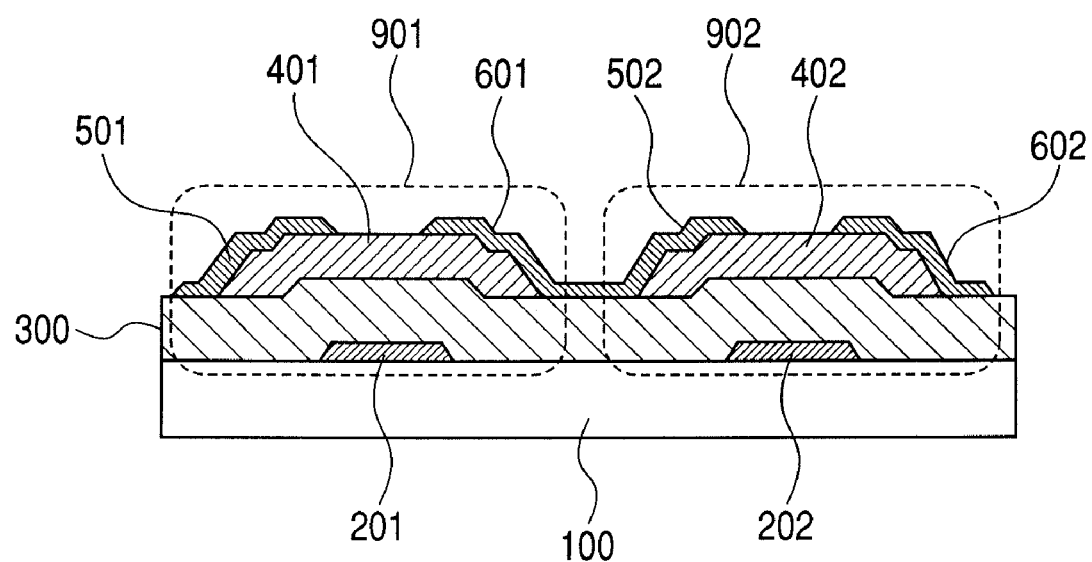
FIG. 4 is a cross sectional view of the second embodiment.
Figure 7A:
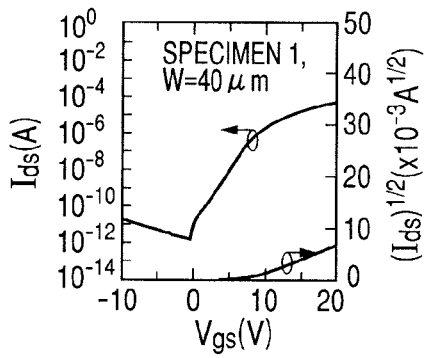
FIGS. 7A, 7B, 7C, 7D, 7E, 7F, 7G and 7H are views indicating $I_{ds}$-$V_{gs}$ characteristics of the fabricated TFT.
Figure 7E:
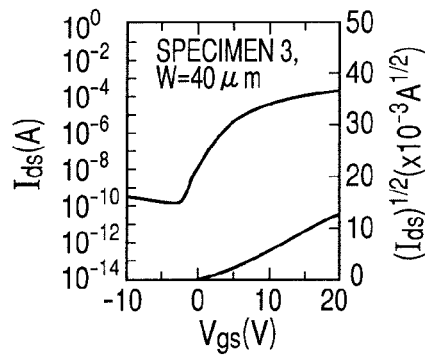
Figure 7B:
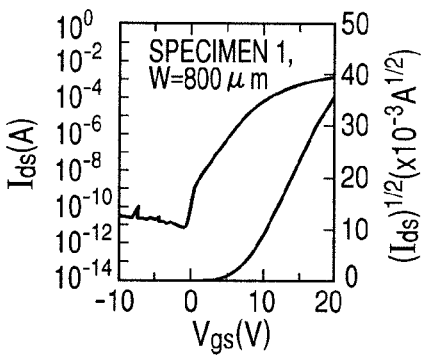
Figure 7F:
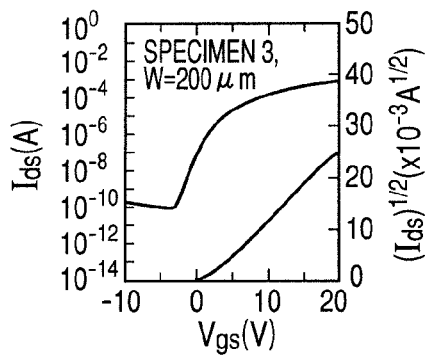
Figure 7C:
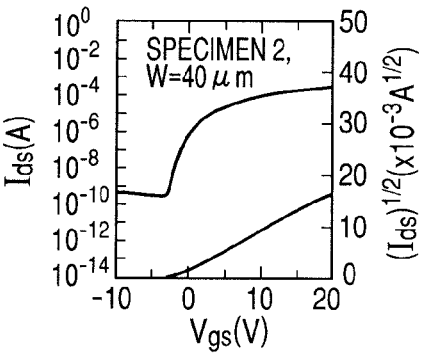
Figure 7G:
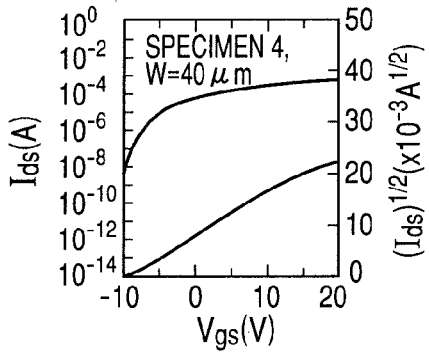
Figure 7D:
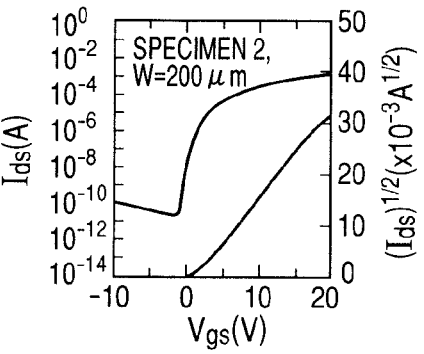
Figure 7H:
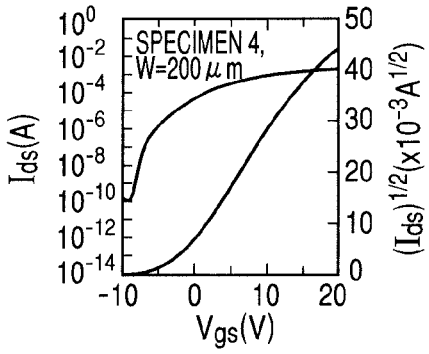

A part of a cross sectional view of an inverter according to the second embodiment of the present invention is indicated in FIG. 4.

The first TFT 901 and the second TFT 902 are fabricated on the substrate 100.

The first TFT 901 includes the first gate electrode 201, the insulator layer 300, the first channel layer 401, the first drain electrode 501 and the first source electrode 601.

The second TFT 902 includes the second gate electrode 202, the insulator layer 300, the second channel layer 402, the second drain electrode 502 and the second source electrode 602.

The first source electrode 601 and the second drain electrode 502 are connected with each other. The first gate electrode 201 is connected with the first source electrode 601 by a wiring (not illustrated).

When the first drain electrode 501 is connected to the power supply voltage $V_{dd}$ terminal and the second source electrode 602 is connected to the ground, an E/D inverter, where the second gate electrode 202 is set to serve as an input node and the second drain electrode 502 is set to serve as an output node, is provided.

That is, a first transistor, which is one transistor, becomes the D-type, and a second transistor, which is the other transistor, operates as the E-type.

The thickness of the first channel layer 401 is approximately equal to the thickness of the second channel layer 402. The first TFT 901 and the second TFT 902 are to have different values of $V_{th}$ by selectively executing a heating process to the channel layer 401 of the first TFT as compared with a process to be executed to the channel layer 402 of the second TFT.

In the present invention, a fact of selectively executing a heating process means to control that the heat is locally (selectively/intensively) applied to only the specific portion (also called a region) previously fixed on the substrate. For instance, there is a method of locally heating only the specific portion. However, there is a case that a part of the heat is transmitted to a portion other than the specific portion when the heating process is executed to the specific portion, but in the present invention, if the influence (influence given to film quality) of the transmitted heat is in a negligible level, such the influence is allowable. It is effective to provide a cooling unit in accordance with necessity in order to suppress the influence of transmitting a part of the heat to a portion other than the specific portion when the heating process is executed to the specific portion. An optimum value in the temperature and time to maintain each TFT varies depending on the composition or thickness of each oxide semiconductor layer of the first TFT and the second TFT.

According to knowledge of the present inventors, with respect to the thermal processing condition and an effect in case of fabricating an oxide semiconductor thin film having the composition of "In (indium):Ga (gallium):Zn (zinc)=1: 0.9:0.6" with the condition to be described later, the following relationship is recognized as an example. That is, a constant effect can be obtained, for instance, by maintaining the first TFT for ten minutes or more with temperature of 200° C. while maintaining the second TFT with temperature equal to or less than 120° C.

In order to selectively heat only the first TFT, various local heating methods of utilizing the contact heating and the heating by the electromagnetic wave irradiation (high frequency wave irradiation, ultraviolet ray irradiation, laser beam irradiation and the like) can be used.

In the present invention, the above-mentioned electromagnetic wave includes a radio frequency wave, a high frequency wave such as a microwave, an ultraviolet ray, a visible ray, an infrared ray, an X-ray and a γ-ray.

In the present invention, the selective heating can be achieved by performing the induction heating of utilizing the resistivity or the specific heat in various materials and the difference in absorption coefficients in the specific wavelength.

In case of performing the induction heating, since the difference in the amount of the heat becomes larger depending on a selection method on materials, it is preferable because the voltage $V_{th}$ can be effectively controlled every the TFT.

In addition, if utilizing the difference in absorption coefficients due to the materials, the specific TFT can be selectively heated also by the collective heating such as the heating by a flash lamp. Concretely, the substances different from structural materials of an electrode corresponding to another TFT are used for structural materials (gate electrode, source/drain electrodes) of an electrode of the specific TFT. By providing such the structure, the specific TFT can be selectively heated by performing the collective optical irradiation upon using a flash lamp or the like. This process is realized because only the electrode portion formed from the material having the high absorption coefficient selectively absorbs the optical energy to heat that portion. In particular, the optical irradiation by the flash lamp is preferable because a heating apparatus is simple.

At this time, in order to control temperature of the specific TFT, the light absorbing material or the light reflecting material may be assigned to materials other than the TFT structural materials. In addition, in accordance with necessity, an optical system such as light focusing, projecting or scanning can be used. Furthermore, in a case that there is a risk of altering film quality due to a fact that the heat of a selectively heated portion transmits to an adjacent part, the cooling unit can be also provided in accordance with necessity.

In other words, in the embodiments of the present invention, it is preferable that the above-mentioned inverter has at least any one kind of structure among the following items A to C.

A: Structure that a structural material of a source electrode of the above-mentioned first transistor is different from that of a source electrode of the above-mentioned second transistor.

B: Structure that a structural material of a drain electrode of the above-mentioned first transistor is different from that of a drain electrode of the above-mentioned second transistor.

C: Structure that a structural material of a gate electrode of the above-mentioned first transistor is different from that of a gate electrode of the above-mentioned second transistor.

In addition, it is preferable that a thermal processing step includes a heating process by the electromagnetic wave irradiation. Further, in the embodiments of the present invention, it is preferable that the above-mentioned inverter has at least any one kind of structure among the following items D to F.

D: Structure that the physical property of a structural material of the source electrode of the above-mentioned first transistor is different from that of the source electrode of the above-mentioned second transistor.

E: Structure that the physical property of a structural material of the drain electrode of the above-mentioned first transistor is different from that of the drain electrode of the above-mentioned second transistor.

F: Structure that the physical property of a structural material of the gate electrode of the above-mentioned first transistor is different from that of the gate electrode of the above-mentioned second transistor.

Then, it is preferable that the above-mentioned physical property is at least one kind of the property to be selected from among the resistivity, the specific heat and the absorption coefficients.

(Third Embodiment)

As indicated in the first embodiment, after fabricating the channel layers having different thickness, the heating process condition of the first channel layer is made to be differed from that of the second channel layer as in a method described in the second embodiment when the thermal process is executed in an arbitrary fabricating process.

As a result of this method, the first TFT 901 and the second TFT 902 have different values of the voltage $V_{th}$.

In order to operate the E/D inverter according to the present invention effectively, an appropriate range as the difference between threshold voltages of two kinds of transistors will be described. FIG. 5 is a view indicating a result of comparing the oscillation characteristic of a 31-stage ring oscillator based on the saturated load E/E inverters with the oscillation characteristic of a 31-stage ring oscillator based on the E/D inverters by a SPICE (Simulation Program with Integrated Circuit Emphasis) simulation method. Evaluation, which is obtained by altering the voltage $V_{th}$ of the load TFT in each condition of a geometrical βratio, a mobility ratio, the power supply voltage ($V_{dd}$) and the voltage $V_{th}$ of an E-type driver TFT indicated in a left side of FIG. 5, is indicated in a right side of FIG. 5. Here, the geometrical β ratio represents a ratio of the W (width)/L (length) ratio of the driver TFT to the W/L ratio of the load TFT. The mobility ratio is a ratio of mobility of the driver TFT to mobility of the load TFT. Note that the channel length was set to become that L=10 μm in all the TFTs. With respect to the channel width, it was set to become that W=40 μm in the load TFTs and W=40×β ratio (μm) in the driver TFTs. The gate overlap length of the each TFT was set to become 5 μm and only the parasitic capacitance caused by such the overlap was considered.

According to FIG. 5, in a case that the voltage $V_{th}$ of the load TFT satisfies the relationship indicated by an expression (2) for the power supply voltage $V_{dd}$ supplied to the inverter, E/D inverter has a merit of at least either the oscillation amplitude or the oscillation frequency of the ring oscillator. That is, in the each E/D inverter, it is excellent in a point at least either the switching speed or the noise margin as compared with the saturated load E/E inverter.

$$0.7 < |(V_{th}(Ld) - V_{th}(Dr))/V_{dd}| < 2 \quad (2)$$

That is, this expression (2) indicates that the E/D inverter is operated by such the power supply voltage, which satisfies that the difference between threshold voltages of the first and second transistors is in a range less than 70% and larger than 200% of the power supply voltage, is supplied.

In the above-mentioned evaluation condition, in a range outside the above-mentioned inequation, there is little merit in constituting the E/D inverter. Concretely, in a case that $|(V_{th}(Ld) - V_{th}(Dr))/V_{dd}| < 0.7$, the inverter lacks current drive to charge the load capacity or unstable oscillation is observed in the ring oscillator. On the other hand, in a case that $|(V_{th}(Ld) - V_{th}(Dr))/V_{dd}| > 2$, the inversion voltage is too high compared with the power supply voltage, and an input/output voltage range becomes narrow.

Additionally, materials for structuring the TFTs to be used in the inverters according to the present invention will be described in detail.

Channel Layer

The oxide semiconductor materials are used for the channel layer. Concretely, ZnO, $In_2O_3$, $Ga_2O_3$ and a mixed crystal thereof or an amorphous solid solution (In—Zn—O, In—Ga—Zn—O or the like) can be used. That is, the oxide semiconductor which includes at least one element selected from among In, Ga and Zn can be used.

Specifically, if an In—Ga—Zn—O film is formed as a channel layer of the TFT by a sputtering method, a transistor having the sufficiently large electric field effect mobility can be fabricated. In this case, since the deposition temperature of materials for the channel layer is low, a light-emitting device can be formed on a flexible substrate such as the plastic.

Further, in the In—Ga—Zn—O film, it is preferable that at least a part of this film includes the amorphous substance. According to this preferable structure, the performance of an etching process is improved.

Source-Drain Electrodes

The materials to be used for the source-drain electrodes are required that the electron injection barrier for the channel layer is sufficiently small in a case that the channel layer is an n-type semiconductor. In case of a p-type semiconductor, it is required that the hole injection barrier is sufficiently small. For instance, a metal such as Al, Cr, W, Ti and Au, an aluminum alloy and a silicide such as WSi can be utilized. In addition, the transparent conductive oxide or the transparent oxide semiconductor having large carrier concentration can be also utilized. The indium tin oxide (ITO), the indium zinc oxide (IZO) and the In—Ga—Zn—O film correspond to the above-mentioned materials.

The source-drain electrodes may be formed by the coupling of plural materials or may be a multilayer film of plural materials.

Gate Electrode

The materials to be used for the gate electrode are selected from the group of materials similar to that of the above-mentioned source-drain electrodes and used. Various metal thin films, conductive oxide thin films and conductive organic thin films can be utilized. The materials can be used for the selective heating by utilizing the difference in physical property such as the resistivity, the specific heat in these various materials or the absorption coefficients in specific wavelength. Note that the selective heating of the channel unit can be achieved also by the materials of the source-drain electrodes.

The gate electrode may be formed by the coupling of plural materials or may be a multilayer film of plural materials.

A flat film is formed on a gate insulator layer, and it is required that the materials have the small conductivity. Concretely, a gate-source leak current $I_{gs}$ is required to be sufficiently small in practical as compared with a drain-source leak current $I_{ds}$.

The film is selected from among $SiO_x$, $SiN_x$ and $SiO_xN_y$ formed by a chemical vapor deposition (CVD) method, $SiO_2$, $SiN_x$, $SiO_xN_y$, $Al_2O_3$, $Y_2O_3$, $HfO_2$ and $Ta_2O_5$ formed by an RF magnetron sputtering method and a multilayer film composed of these materials. As illustrated in FIG. 3, the film may be shared by two or more than TFTs or may be an individual film distinguished every TFT.

When the E/D inverter is fabricated by two kinds of TFTs, two threshold voltages of $V_{th}$ are not always required to be in such a relation that the one is negative voltage and the other is positive voltage is kept, in case of being built in a circuit. Even if the two kinds of TFTs are E-types or D-types, in a case that the two threshold voltages of $V_{th}$ are sufficiently separated each other and the two TFTs can be distinguishably utilized from a viewpoint of the circuit design, the present invention can be applied.

Furthermore, also in case of fabricating three or more kinds of TFTs, in which threshold voltages of $V_{th}$ can be distinguished each other, the present invention can be similarly applied.

The physical property of an amorphous In—Ga—Zn—O film to be used as the channel layer of the TFT is evaluated.

As a substrate on which a film is formed, a degreased cleaned glass substrate (Corning Corporation product 1737) was prepared. As the target material, a polycrystalline sintered body (size: diameter 98 mm, thickness 5 mm) having the $InGaO_3$ (ZnO) composition was used.

This sintered body was fabricated by the wet blending process of $In_2O_3$:$Ga_2O_3$:ZnO (4N reagent each, solvent: ethanol), a pre-sintering process (at 1000° C. for two hours), a dry grinding process and a main sintering process (at 1500° C. for two hours) as the starting material.

The electric conductivity of this target material is 0.25 (S/cm), which indicated the semi-insulation condition.

The background pressure in a deposition chamber is $3 \times 10^{-4}$ Pa, and the total pressure during deposition (namely, film formation) was set as 0.53 Pa by the oxygen-argon mixture gas which includes oxygen of 3.3 vol %.

The substrate temperature is not intentionally controlled, and distance between the target material and the substrate on which the film is formed was 80 mm. The applied electric power was RF300 W and a film was formed with a deposition rate of 2 (Å/s).

For a 60 nm-thick deposited film, an X-ray is incident to a surface to be measured at an incident angle of 0.5 degrees and the X-ray diffraction measurement was performed by a thin film method. As a result, since an obvious diffraction peak was not confirmed, it was judged that the fabricated In—Ga—Zn—O film is amorphous.

As a result of an X-ray fluorescence (XRF) analysis, a metal composition ratio of the thin film was indicated by an expression of In:Ga:Zn=1:0.9:0.6.

After performing the measurement of two terminals I-V by a coplanar-type electrode pattern of using a evaporated multilayer film of Ti and Au, when the electric conductivity of the thin film was measured, it was about $7\times10^{-5}$ (S/cm). If it is assumed that the electron mobility is about 5 (cm$^2$/Vs), it is estimated that the electron carrier concentration is about $10^{14}$ (cm$^{-3}$).

According to the above inspection, it was confirmed that a fabricated In—Ga—Zn—O system thin film includes In, Ga and Zn and at least a part of the thin film is an amorphous oxide.

Hereinafter, the substance for forming a channel layer to be fabricated includes the In, Ga and Zn and at least a part of the substance is an amorphous oxide.

It is allowed that the metal composition ratio is not the above-mentioned ratio of In:Ga:Zn=1:0.9:0.6.

Then, plural TFTs are respectively fabricated on different four substrates by the following procedure, and specimens 1 to 4 are prepared. A cross sectional view of the TFT fabricated in each of the specimens 1 to 4 is indicated in FIG. 6.

The cleaned glass substrate (Corning Corporation product 1737) is employed as the substrate 100, and Ti and Au are evaporated on this substrate 50 nm in total by an electron beam evaporation method and then the patterning is performed by a lift-off method, thereby obtaining the gate electrode 200. Next, a SiO$_2$ layer to become the gate insulator layer 300 is formed (deposition gas: Ar, deposition pressure: 0.1 Pa, applied electric power: 400 W, film thickness: 100 nm) on an entire surface by the RF magnetron sputtering method. An aperture is formed in a part (not illustrated) of the gate insulator layer 300 located on an upper portion of the gate electrode 200 by the etching, and a contact hole used for contacting with the gate electrode 200 was obtained. Subsequently, an amorphous IGZO (In—Ga—Zn—O) layer was formed (deposition gas: O$_2$ (3.3 vol %)+Ar, deposition pressure: 0.53 Pa, applied electric power: 300 W) by the RF magnetron sputtering method as a channel layer 400. The film thickness was set as 30 nm in the specimens 1 and 2 and set as 60 nm in the specimens 3 and 4. In the course of deposition by the sputtering method, the substrate temperature was not specially controlled.

Subsequently, the channel layer 400 was patterned in a predetermined channel size by the etching.

Subsequently, the specimens 2 and 4 were entirely and uniformly heated on a hot plate, of which temperature was set as 300° C., for twenty minutes in the air atmosphere. This thermal process was not executed to the specimens 1 and 3.

At last, Ti and Au are evaporated again to form a film, of which thickness is 100 nm in total, by the electron beam evaporation method and then a drain electrode 500 and a source electrode 600 were formed by the lift-off method. The TFTs, of which channel width W are 40 μm and 200 μm or 800 μm, were fabricated in the respective specimens. The channel length L was set as L=10 μm for the respective specimens.

The $I_{ds}$-$V_{gs}$ characteristics measured at a voltage of $V_{ds}$=+10 V in these specimens are indicated in FIGS. 7A to 7H. All of these characteristics obviously indicate the n-channel TFT characteristics.

When the electric field effect mobility p and the threshold voltage $V_{th}$ are calculated, the following result was obtained.

Specimen 1 (channel layer thickness d=30 nm, a thermal process is not executed)
W=40 μm: μ=6.5, $V_{th}$=+3.5
W=800 μm: μ=2.0, $V_{th}$=+3.4

Specimen 2 (channel layer thickness d=30 nm, a thermal process is executed)
W=40 μm: μ=9.3, $V_{th}$=−0.23
W=800 μm: μ=7.8, $V_{th}$=+1.4

Specimen 3 (channel layer thickness d=60 nm, a thermal process is not executed)
W=40 μm: μ=6.0, $V_{th}$=+2.1
W=200 μm: μ=4.2, $V_{th}$=+1.5

Specimen 4 (channel layer thickness d=60 nm, a thermal process is executed)
W=40 μm: μ=9.7, $V_{th}$=−10.1
W=200 μm: μ=15, $V_{th}$=−3.0

Both of the TFTs in the specimens 1 and 3 are E-types and the TFT in the specimen 4 is D-type.

On the other hand, in the TFT having the channel width of W=40 μm in the specimen 2, although the voltage $V_{th}$ is negative in a precise sense, it is expected that the TFT operates as the E-type TFT depending on combination of another TFT as will be indicated later.

Although it was not specially described, since all the specimens are dried (120° C. for ten minutes) plural times in the air in the course of a fabrication process, it is considered that the change of electrical property by the application of heat under the condition matching the above-mentioned condition can be disregarded also in the time after completion of the specimens.

The inverters as in the following respective embodiments are fabricated on the basis of the above-mentioned experiment.

<Embodiment 1>

Figure 8:
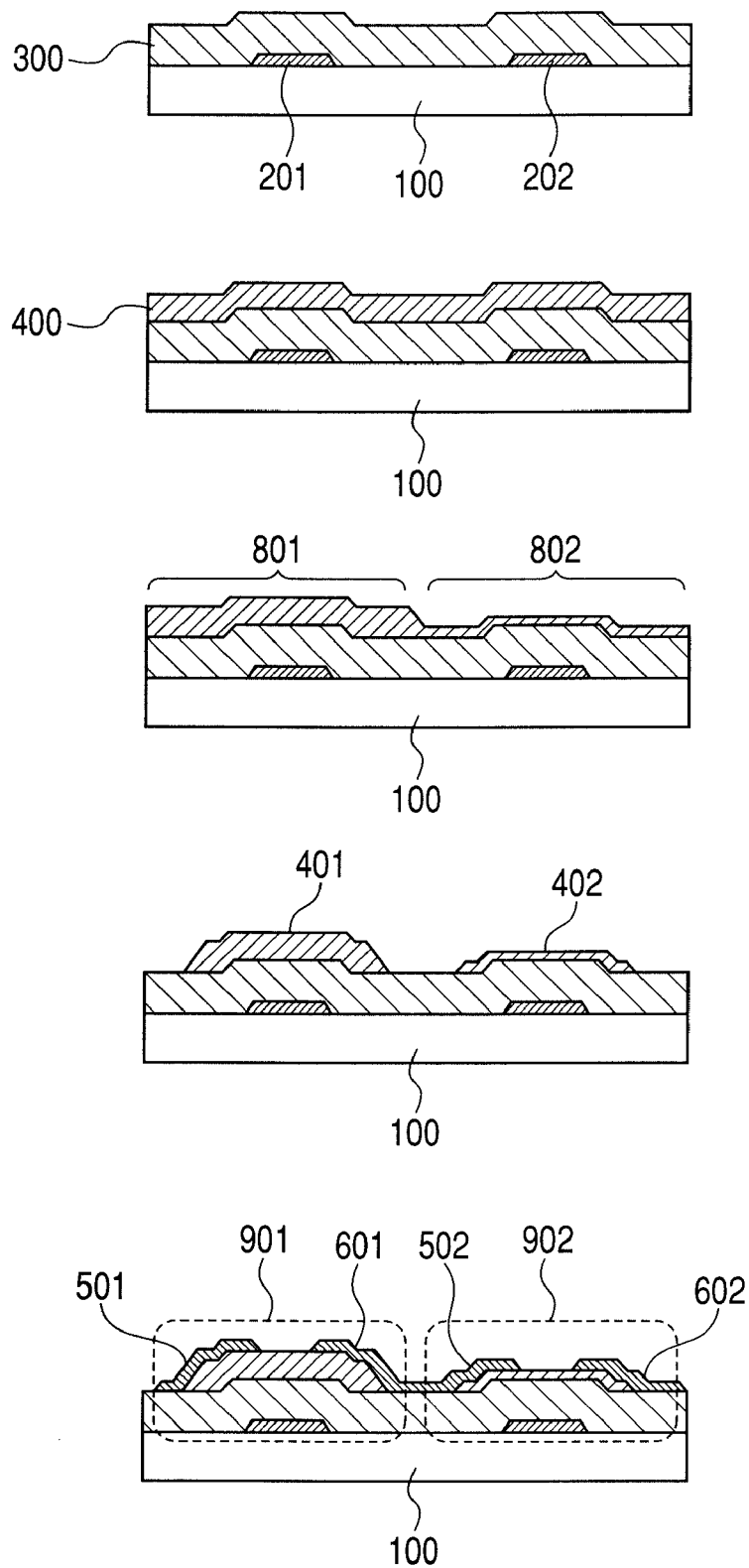
FIG. 8 is cross sectional views indicating the fabrication process of the E/D inverter in the Embodiment 1, the Embodiment 4 and a comparative example 4-1.

The present embodiment 1 is an example of utilizing the first embodiment. A fabrication process of an E/D inverter using an oxide semiconductor thin film transistor in the Embodiment 1 is indicated in FIG. 8.

The cleaned glass substrate (Corning Corporation product 1737) is employed as the substrate 100. After forming the photoresist (not illustrated) on this substrate by a first photolithography process, Ti and Au are evaporated 50 nm in total by the electron beam evaporation method and then the patterning is performed by the lift-off method, thereby obtaining the first gate electrode 201 and the second gate electrode 202.

Next, the SiO$_2$ layer to become the gate insulator layer 300, which is common to the first TFT and the second TFT, is formed (deposition gas: Ar, deposition pressure: 0.1 Pa, applied electric power: 400 W, film thickness: 100 nm) on an entire surface by the RF magnetron sputtering method. After forming the photoresist (not illustrated) on this formed film by a second photolithography process, a part of the gate insulator layer 300 located on upper portions of the gate electrodes 201 and 202 is patterned by the etching, and a contact hole (not illustrated) is obtained.

Subsequently, the amorphous IGZO film 400 (common deposition film) to become a channel layer composed of an oxide semiconductor is formed (deposition gas (i.e., film formation gas): O$_2$ (3.3 VOL %)+Ar, deposition pressure (i.e., film formation pressure): 0.53 Pa, applied electric power: 300 W) by the RF magnetron sputtering method. A film, of which thickness is 60 nm, is formed on both portions corresponding to the respective channel layers of the first and second TFTs. The substrate temperature is not specially controlled in the course of the deposition by the sputtering method.

Subsequently, the photoresist (not illustrated) is formed on an upper portion of the amorphous IGZO film 400 in a region 801, where the first TFT is formed, by a third photolithography process and then the amorphous IGZO film 400 is dry etched. The etching is performed while adjusting time and intensity in order that the thickness of the amorphous IGZO film 400 in a region 802, where the second TFT is formed, becomes 30 nm.

After forming the photoresist (not illustrated) by a fourth photolithography process, the amorphous IGZO film 400 is etched to divide the amorphous IGZO film in order that the channel layer becomes an independent layer every transistor. In this manner, the first channel layer 401 and the second channel layer 402 are obtained.

Subsequently, the whole structure is uniformly heated on a hot plate, of which temperature was set as 300° C., for twenty minutes in the air atmosphere.

At last, after forming the photoresist (not illustrated) by a fifth photolithography process, Ti and Au are evaporated again to form a film, of which thickness is 100 nm in total, by the electron beam evaporation method. Then, the first drain electrode 501, the first source electrode 601, the second drain electrode 502 and the second source electrode 602 are formed by the lift-off method. At this time, the first source electrode 601 and the second drain electrode 502 are integrally formed as in FIG. 8 and electrically connected with each other. In addition, the first source electrode 601 is connected with the first gate electrode 201 by simultaneously forming an interlayer wiring (not illustrated) via the above-mentioned contact hole together with the source-drain electrodes.

According to the above, an E/D inverter, in which the first drain electrode 501 is regarded as an voltage supply node and the second source electrode 602 is regarded as an ground node, is completed.

Note that the photolithography processes are executed five times.

Figure 9:
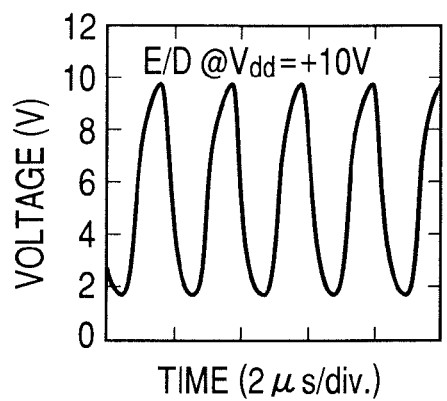
FIG. 9 is a view indicating an output simulation waveform of a ring oscillator composed of the E/D inverters in the Embodiment 1.

In order to estimate the dynamic characteristics of the E/D inverter fabricated by the above-mentioned procedure, a circuit simulation of a 5-stage ring oscillator, which is composed of E/D inverters characterized in that each of the TFTs having width of W=40 μm in the specimen 4 is set as a load TFT and each of the TFTs having width of W=200 μm in the specimen 2 is set as a driver TFT, was performed. For the simulation, a Level 1 (n-channel type MOS) model of a gradual channel, which is the most simple MOS model, was used. As a result, the 5-stage ring oscillator oscillated with 470 kHz at the external power supply voltage of +10 V. The delay time was 0.21 μs. The amplitude is 8.0 V, and a maximum value +9.7 V of the output voltage approximates the power supply voltage of +10 V. An output waveform is indicated in FIG. 9.

In this Embodiment 1, the E/D inverter can be simply structured by only increasing the photolithography process one time for a fabrication process of the saturated load E/E inverter indicated in a Comparative Example 1-1.

COMPARATIVE EXAMPLE 1-1

Figure 10:
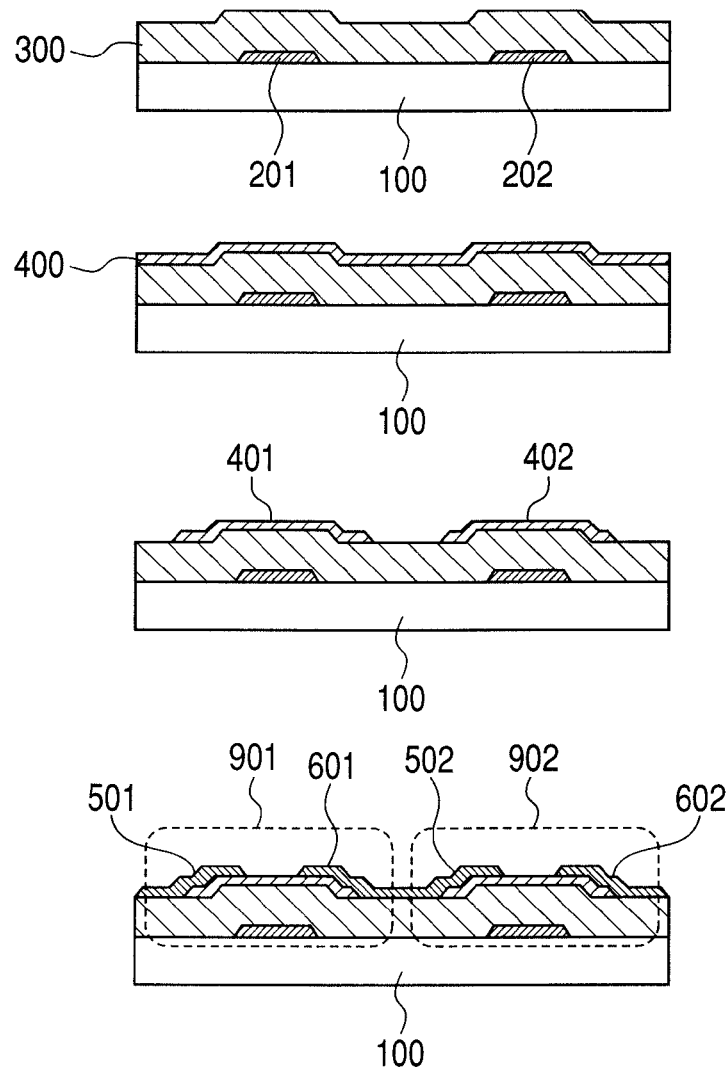
FIG. 10 is cross sectional views indicating the fabrication process of the saturated load E/E inverter in a comparative example 1-1 and a comparative example 4-2.

Although the present fabrication method is similar to that in the Embodiment 1, two kinds of TFTs are fabricated on the same substrate without executing a process of adjusting layer thickness of the both channel layers to have different thickness. That is, the two kinds of TFTs are fabricated on the same substrate under a state that channels of the both TFTs have the same film thickness of 30 nm and with a fabrication method also having the same heating process condition. Then the saturated load E/E inverter can be fabricated. A process flow related to the above is indicated in FIG. 10.

The cleaned glass substrate (Corning Corporation product 1737) is employed as the substrate 100.

After forming the photoresist (not illustrated) on this substrate by the first photolithography process, Ti and Au are evaporated 50 nm in total by the electron beam evaporation method and then the patterning is performed by the lift-off method, thereby obtaining the first gate electrode 201 and the second gate electrode 202.

Next, the $SiO_2$ layer to become the gate insulator layer 300, which is common to the first TFT and the second TFT, is formed (deposition gas: Ar, deposition pressure: 0.1 Pa, applied electric power: 400 W, film thickness: 100 nm) on an entire surface by the RF magnetron sputtering method. After forming the photoresist (not illustrated) on this formed film by the second photolithography process, the gate insulator layer 300 is patterned by the etching, and a contact hole (not illustrated) is obtained on upper portions of the gate electrodes 201 and 202.

Subsequently, the amorphous IGZO film is formed (deposition gas: $O_2$ (3.3 VOL %)+Ar, deposition pressure: 0.53 Pa, applied electric power: 300 W) by the RF magnetron sputtering method as the channel layer 400. A film, of which thickness is 30 nm, is formed on both portions corresponding to the respective channel layers of the first TFT and the second TFT. The substrate temperature is not specially controlled in the course of the deposition by the sputtering method.

After forming the photoresist (not illustrated) by the third photolithography process, the channel layer 400 is etched, and the first channel layer 401 and the second channel layer 402 are obtained.

Subsequently, the whole structure is uniformly heated on a hot plate, of which temperature was set as 300° C., for twenty minutes in the air atmosphere.

At last, after forming the photoresist (not illustrated) by the fourth photolithography process, Ti and Au are evaporated again to form a film, of which thickness is 100 nm in total, by the electron beam evaporation method. Then, the first drain electrode 501, the first source electrode 601, the second drain electrode 502 and the second source electrode 602 are formed by the lift-off method. At the same time, the first drain electrode 501 is connected with the first gate electrode 201 by forming an interlayer wiring (not illustrated) via the above-mentioned contact hole.

The first source electrode 601 is integrated with the second drain electrode 502.

According to the above, a saturated load E/E inverter, in which the first drain electrode 501 is regarded as an voltage supply node and the second source electrode 602 is regarded as an ground node, is completed. The photolithography processes are executed four times.

Figure 11:
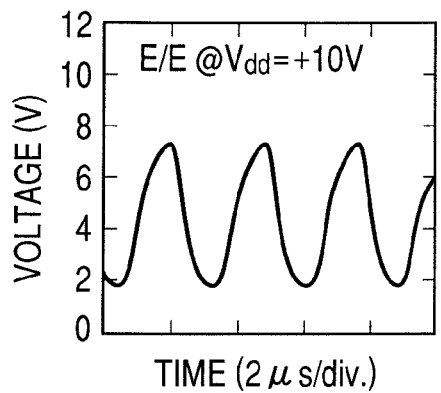
FIG. 11 is a view indicating an output simulation waveform of a ring oscillator composed of the saturated load E/E inverters in the comparative example 1-1.

In order to estimate the dynamic characteristics of the saturated load E/E inverter fabricated by the above-mentioned procedure, the following circuit simulation was performed. That is, a circuit simulation of a 5-stage ring oscillator, which is composed of the saturated load E/E inverters characterized in that each of the TFTs having width of W=40 μm in the specimen 2 is set as a load TFT and each of the TFTs having width of W=200 μm in the specimen 2 is set as a driver TFT, was performed. An output waveform is indicated in FIG. 11. The 5-stage ring oscillator oscillated at 350 kHz at the external power supply voltage of +10 V. The delay time per one stage is 0.29 μs, which was extended forty percent as compared with the Embodiment 1. The amplitude is 5.5 V, and a maximum value of the output voltage is +7.1 V, which decreased about 3 V for the power supply voltage of +10 V.

That is, the E/D inverter in the Embodiment 1 operates at higher speed with larger amplitude than the saturated load E/E inverter in the present comparative example. And, according to the fabrication method in the Embodiment 1, it can be expected that an inverter more excellent than that in the comparative example 1-1 can be obtained.

Note that the voltage $V_{th}$ of the TFT having width of W=40 μm in the specimen 2 is slightly negative to 0 V in a precise sense. However, it is important to be an approximate value with the voltage $V_{th}$ of the TFT having width of W=200 μm in the specimen 2, and the load TFT having width of W=40 μm in the specimen 2 can be substantially regarded as an E-type in this combination.

And, a circuit simulation of a 5-stage ring oscillator, in which each of the TFTs having width of W=40 μm in the specimen 4 is regarded as the load TFT and each of the TFTs having width of W=200 μm in the specimen 4 is treated as the driver TFT, was also performed. The oscillation could not be found in any case that the inverter is the E/D inverter or the saturated load E/E inverter.

COMPARATIVE EXAMPLE 1-2

A fabrication method of an E/D inverter similar to that in the above-mentioned Embodiment 1 based on a channel layer forming method disclosed in Japanese Patent Application Laid-Open No. 2006-165532 is considered. In a method disclosed in Japanese Patent Application Laid-Open No. 2006-165532, the voltage $V_{th}$ is controlled by the concentration of the nitric monoxide flowed into the ZnO deposition atmosphere. In case of fabricating a TFT having two kinds of voltages $V_{th}$ on the same substrate, a process of forming the separate channel layers having different doping concentration is required in order to obtain a first channel layer and a second channel layer respectively.

Figure 12:
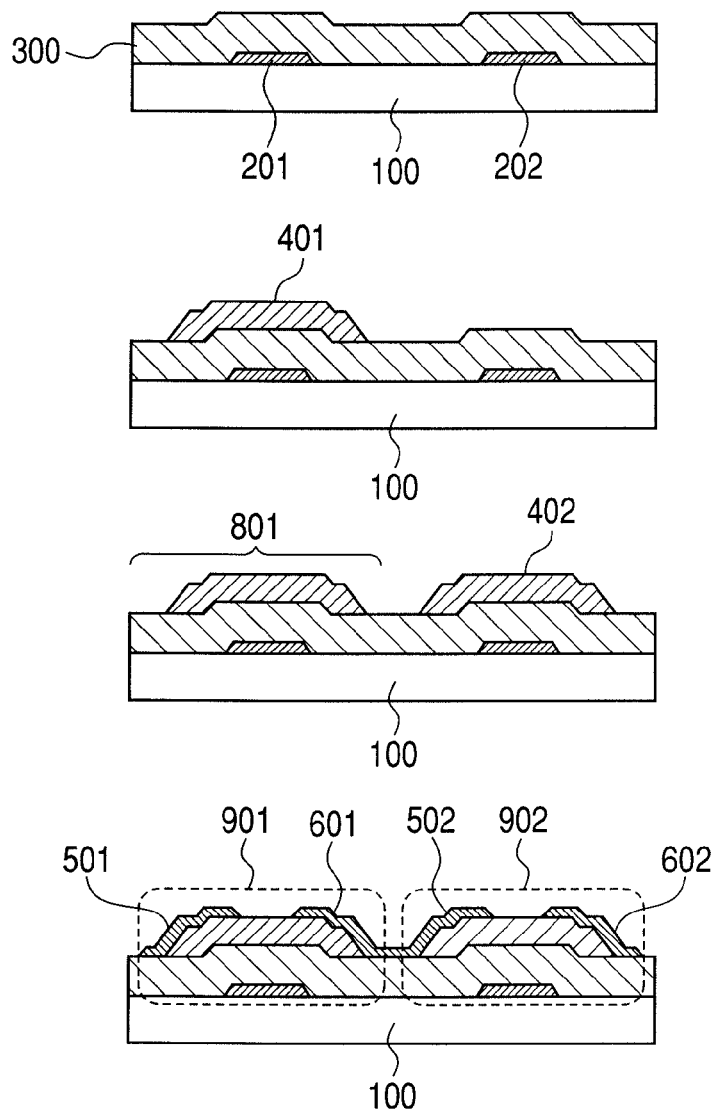
FIG. 12 is cross sectional views indicating the fabrication process of the saturated load E/E inverter in a comparative example 1-2.

The E/D inverter can be fabricated with the following process similar to that in the Comparative Example 1-1. A fabricating process will be described by using FIG. 12.

The cleaned glass substrate (Corning Corporation product 1737) is employed as the substrate 100.

After forming the photoresist (not illustrated) on this substrate by the first photolithography process, Ti and Au are evaporated 50 nm in total by the electron beam evaporation method and then the patterning is performed by the lift-off method, thereby obtaining the first gate electrode 201 and the second gate electrode 202.

Next, the $SiO_2$ layer to become the gate insulator layer 300, which is common to the first TFT and the second TFT, is formed (deposition gas: Ar, deposition pressure: 0.1 Pa, applied electric power: 400 W, film thickness: 100 nm) on an entire surface by the RF magnetron sputtering method. After forming the photoresist (not illustrated) on this formed film by the second photolithography process, the gate insulator layer 300 is patterned by the etching, and a contact hole (not illustrated) is obtained on upper portions of regions (not illustrated) of the gate electrodes 201 and 202.

Subsequently, a ZnO layer to become the first channel layer 401 is formed by a pulse laser deposition method. The intentional doping is not performed to the first channel layer 401. The photoresist (not illustrated) is formed by the third photolithography process and the patterning is performed by the etching, and the first channel layer 401 is obtained. Additionally, a ZnO layer to become the second channel layer 402 is formed by the pulse laser deposition method with the similar procedure. At this time, the nitrogen is doped into the second channel layer 402 by setting the deposition atmosphere to the mixture gas of oxygen and nitric monoxide. The photoresist (not illustrated) is formed by the fourth photolithography process and the patterning is performed by the etching, and the second channel layer 402 is obtained.

At last, after forming the photoresist (not illustrated) by the fifth photolithography process, Ti and Au are evaporated again to form a film, of which thickness is 100 nm in total, by the electron beam evaporation method. Then, the first drain electrode 501, the first source electrode 601, the second drain electrode 502 and the second source electrode 602 are formed by the lift-off method. At the same time, the first source electrode 601 is connected with the first gate electrode 201 by forming an interlayer wiring (not illustrated) via the above-mentioned contact hole.

The first source electrode 601 and the second drain electrode 502 are integrally formed.

According to the above, an E/D inverter, in which the first drain electrode 501 is regarded as an voltage supply node and the second source electrode 602 is regarded as an ground node, is completed. Note that a protection layer may be appropriately formed on this completed inverter continuously, and the difference between the voltage $V_{th}$ of the first transistor 901 and the voltage $V_{th}$ of the second transistor 902 may be more preferably adjusted.

The photolithography processes with the above-mentioned procedure are executed five times, which is equal to the processing number of times in the Embodiment 1.

However, the fabrication of the inverter with the above-mentioned procedure is actually difficult, and the photolithography processes are required at least six times, which is increased one time for the case in the Embodiment 1.

As a reason for the above, the following two points are enumerated.

A first point problem is as mentioned below. When forming the second channel layer 402, the first channel layer 401 also enters in a deposition chamber. In the above-mentioned method, it can not be avoided that the first channel layer 401 is put in the deposition atmosphere in the course of forming the second channel layer 402. As a result, it is not preferable because there is a risk that the electric property of the first channel layer 401 varies before or after the formation of the second channel layer 402. In order to prevent this situation, in case of providing some sort of sealing layer (photoresist or $SiN_x$ sputtering film) on the first channel layer 401 to protect the first channel layer 401 from the deposition atmosphere of the second channel layer 402, the photolithography process is further required.

A second point problem is as mentioned below. In case of patterning the second channel layer 402 by the etching after patterning the first channel layer 401, an etching selection ratio of the latter layer to the former layer becomes important in order that the former layer is not encroached by the etching of the latter layer. However, the difference between the structural components of the first channel layer 401 and the second channel layer 402 is only the contained amount of dopant, and it is considered that the etching selection ratio approximates to one. Therefore, in order to perform the assured etching, an etching protection layer has to be provided on the region 801 where the first TFT is formed. Also, in this case, the photolithography process is further required.

Consequently, a fabrication method of the present invention is able to fabricate the E/D inverter by a simple method with the processing number of times less than that in an E/D inverter fabrication method applied to the conventional technology.

<Embodiment 2>

A case of using the lift-off method in a channel layer forming portion in the Embodiment 1 will be indicated in the Embodiment 2. The related process will be described by using FIG. 8 again.

After obtaining a contact hole by a method similar to that in the Embodiment 1, the amorphous IGZO film 400 to become a part of the channel layer is continuously formed (deposition gas: $O_2$ (3.3 VOL %)+Ar, deposition pressure: 0.53 Pa, applied electric power: 300 W) by the RF magnetron sputtering method. A film, of which thickness is 30 nm, is formed for the same thickness on both portions corresponding to the respective channel layers of the first TFT and the second TFT. The substrate temperature is not specially controlled in the course of the deposition by the sputtering method.

Subsequently, the photoresist (not illustrated) is formed on an upper portion of the amorphous IGZO film 400 in the region 802, where the second TFT is formed, by a third photolithography process. The photoresist is suitably thermally processed, and it is preferable to increase the tolerance for the sputtering damage in the subsequent process. The amorphous IGZO film, of which thickness is 30 nm, is formed again as remainder of the amorphous IGZO film 400 on this photoresist and the region 801, where the first TFT is formed, by the RF magnetron sputtering method under the similar condition. Additionally, the whole structure is rinsed by the photoresist remover solvent to remove the photoresist and the amorphous IGZO film formed on an upper portion of the photoresist, and the channel layer is deposited on only the first TFT to form the channel layer of the first TFT. At this time, channel layers having different thickness are obtained every TFT of the two TFTs as indicated in FIG. 8.

Thereafter, the E/D inverter is completed by the procedure similar to that in the Embodiment 1. Note that the photolithography processes are executed five times.

In this manner, in case of using the lift-off method when forming the channel layer, the similar effect to that in the Embodiment 1 can be obtained. In addition, the controllability of the channel layer thickness is excellent as compared with the Embodiment 1.

<Embodiment 3>

The present embodiment 3 is an example of utilizing the second embodiment. A fabricating process of the E/D inverter using an oxide thin film transistor in the Embodiment 3 will be indicated in FIG. 13.

The indium tin oxide (ITO, conductivity: $1\times10^4$ S/cm) film, of which thickness is 200 nm, is formed on the cleaned glass substrate (Corning Corporation product 1737) by the RF magnetron sputtering method, and the photoresist (not illustrated) is formed on this formed film by the first photolithography process. Thereafter, the patterning is performed by the etching, and the first gate electrode 201 is obtained.

Subsequently, after forming the photoresist (not illustrated) on this glass substrate by the second photolithography process, Ti and Au are evaporated 50 nm in total by the electron beam evaporation method and the patterning is performed by the lift-off method, and the second gate electrode 202 is obtained.

Next, the $SiO_2$ layer to become the gate insulator layer 300, which is common to the first TFT and the second TFT, is formed (deposition gas: Ar, deposition pressure: 0.1 Pa, applied electric power: 400 W, film thickness: 100 nm) on an entire surface by the RF magnetron sputtering method. After forming the photoresist (not illustrated) on this formed film by the third photolithography process, the patterning is performed by the etching, and a contact hole (not illustrated) is obtained.

Subsequently, the amorphous IGZO film 400 to become the channel layer is formed (deposition gas: $O_2$ (3.3 VOL %)+Ar, deposition pressure: 0.53 Pa, applied electric power: 300 W) by the RF magnetron sputtering method. A film, of which thickness is 60 nm, is formed on both portions corresponding to the respective channel layers of the first TFT and the second TFT. The substrate temperature is not specially controlled in the course of the deposition by the sputtering method. The amorphous IGZO film 400 is etched to divide it in order that the channel layer becomes an independent layer every transistor. In this manner, the first channel layer 401 and the second channel layer 402 are obtained.

Subsequently, the whole structure is inductively heated. Since the resistivity of the ITO electrode is about fifty times higher than that of Au, the first gate electrode 201 is selectively heated as compared with the second gate electrode 202. The power of AC applied magnetic field, frequency and an applying time which were optimized are used. And, the deterioration of a heating selection ratio due to the heat conduction of the substrate is prevented by intermittently applying the AC magnetic field to be used for the induction heating in accordance with necessity. It is also effective that the heat applied to the gate electrode 202 is cooled by utilizing a cooling unit such as a heat sink.

At last, after forming the photoresist (not illustrated) by the fifth photolithography process, Ti and Au are evaporated again to form a film, of which thickness is 100 nm in total, by the electron beam evaporation method. Thereafter, the first drain electrode 501, the first source electrode 601, the second drain electrode 502 and the second source electrode 602 are formed by the lift-off method. At the same time, the first source electrode 601 is connected with the first gate electrode 201 by forming an interlayer wiring (not illustrated) via the above-mentioned contact hole.

The first source electrode 601 and the second drain electrode 502 are integrally formed.

According to the above, an E/D inverter, in which the first drain electrode 501 is regarded as an voltage supply node and the second source electrode 602 is regarded as an ground node, is completed. Note that the photolithography processes are executed five times.

In order to estimate the dynamic characteristics of the E/D inverter, a circuit simulation of a 5-stage ring oscillator, which is composed of E/D inverters characterized in that the TFT having width of W=40 μm in the specimen 4 is set as a load TFT and the TFT having width of W=200 μm in the specimen 3 is set as a driver TFT, was performed.

Figures 14, 15:
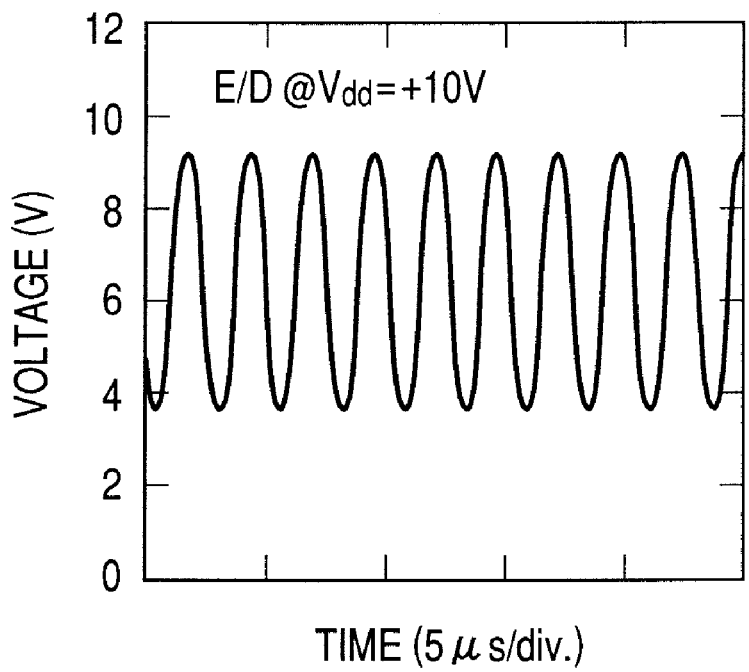
FIG. 14 is a view indicating an output simulation waveform of a ring oscillator composed of the E/D inverters in the Embodiment 3.
FIG. 15 is a view indicating an output simulation waveform of a ring oscillator composed of the saturated load E/E inverters in a comparative example 3-1.

As a result, the 5-stage ring oscillator oscillated with 390 kHz at the external power supply voltage of +10 V. The delay time was 0.26 μs. The amplitude is 5.5 V, and a maximum value of the output voltage per one stage was +9.0 V, which decreased 1.0 V from the power supply voltage of +10 V. An output waveform is indicated in FIG. 14.

In the present embodiment, the E/D inverter can be simply structured by only increasing the photolithography process one time for a fabricating process of the saturated load E/E inverter (Comparative Example 3-1).

Alternatively, the same material may be used for materials of structuring the source, drain and gate electrodes in these two kinds of TFTs. Even if such the structure is adopted and the channel layer having the same thickness was formed, an effect similar to that in the Embodiment 3 can be obtained, as long as only the vicinity of the first channel layer 401 is intensively heated by the contact heating or a laser annealing method at a time of executing the heating process of the channel layer.

In this case, the photolithography processing number of times can be reduced one time.

However, the device can be simplified and the controllability is improved as in the Embodiment 3, if the induction heating is performed by fabricating the TFT which includes the different materials for structuring the source, drain and gate electrodes or if applying the heat by a flash lamp by utilizing the difference in absorption coefficients due to materials.

In the present Embodiment 3, the induction heating is performed by using different materials for the gate electrodes in the two kinds of transistors. However, an effect similar to that in the Embodiment 3 can be obtained by also performing the induction heating by using different materials for electrodes other than the gate electrode such as a source or drain electrode of the first transistor or the corresponded electrode in the second transistor.

COMPARATIVE EXAMPLE 3-1

Although the present fabrication method is similar to that in Embodiment 3, the two kinds of TFTs are fabricated on the same substrate by setting the thickness of the both channel layers as 60 nm in a manner that the selective heating for the first channel layer 401 is not performed and the heating processes for the channels of the both TFTs are not performed. Then the saturated load E/E inverter can be fabricated by using the photolithography processes four times similar to the Comparative Example 1-1 in the Embodiment 1.

In order to estimate the dynamic characteristics of the saturated load E/E inverter, a circuit simulation of a 5-stage ring oscillator, which is composed of saturated load E/E inverters characterized in that the TFT having width of W=40 μm in the specimen 3 is set as a load TFT and the TFT having width of W=200 μm in the specimen 3 is set as a driver TFT, was performed. As a result, the 5-stage ring oscillator oscillated with 150 kHz at the external power supply voltage of +10 V, and the amplitude was 4.4 V. The delay time per one stage was 0.66 μs, which was extended about two and half times for the Embodiment 3. A maximum value of the output voltage is about +6 V, which considerably decreased as compared with the Embodiment 3. That is, the E/D inverter in the Embodiment 3 operates at a higher speed with larger amplitude than the saturated load E/E inverter in this comparative example. Therefore, according to the fabrication method in the Embodiment 3, it can be expected that an inverter more excellent than that in this comparative example can be obtained. An output waveform is indicated in FIG. 15.
<Embodiment 4>

The present embodiment 4 is an example of utilizing the third embodiment. A fabricating process of the E/D inverter using an oxide semiconductor thin film transistor in the Embodiment 4 will be indicated in FIG. 8.

The cleaned glass substrate (Corning Corporation product 1737) is employed as the substrate 100.

After forming the photoresist (not illustrated) on this glass substrate by the first photolithography process, Ti and Au are evaporated 50 nm in total by the electron beam evaporation method and then the patterning is performed by the lift-off method, thereby obtaining the first gate electrode 201 and the second gate electrode 202.

Next, the $SiO_2$ layer to become the gate insulator layer 300, which is common to the first and second TFTs, is formed (deposition gas: Ar, deposition pressure: 0.1 Pa, applied electric power: 400 W, film thickness: 100 nm) on an entire surface by the RF magnetron sputtering method. After forming the photoresist (not illustrated) on this formed film by the second photolithography process, a part of the gate insulator layer 300 located on upper portions of the first gate electrode 201 and the second gate electrode 202 is patterned by the etching, and a contact hole (not illustrated) is obtained.

Subsequently, the amorphous IGZO film 400 to become the channel layer, is formed (deposition gas: $O_2$ (3.3 VOL %)+Ar, deposition pressure: 0.53 Pa, applied electric power: 300 W) by the RF magnetron sputtering method. A film, of which thickness is 60 nm, is formed on both portions corresponding to the respective channel layers of the first TFT and the second TFT. The substrate temperature is not specially controlled in the course of the deposition by the sputtering method.

Subsequently, the photoresist (not illustrated) is formed on an upper portion of the amorphous IGZO film 400 in a region 801, where the first TFT is formed, by the third photolithography process and then the amorphous IGZO film 400 is dry etched. The etching is performed while adjusting time and intensity in order that the thickness of the amorphous IGZO film 400 in a region 802, where the second TFT is formed, becomes 30 nm.

After forming the photoresist (not illustrated) by the fourth photolithography process, the amorphous IGZO film 400 is etched to divide it in order that the channel layer becomes an independent layer every transistor. In this manner, the first channel layer 401 and the second channel layer 402 are obtained.

Subsequently, only the vicinity of the first channel layer 401 is intensively heated by the focused laser beam. At this time, although it was not hot as in the first channel layer 401, the second channel layer 402 is slightly heated due to the heat conduction of the substrate.

However, as confirmed by indicating the graphs in FIGS. 7A to 7H, since variation of the voltage $V_{th}$ of the TFT using the second channel layer is small before and after the heating as compared with the TFT using the first channel layer, it is treated that the heating process is not performed to the channel layer 402.

At last, after forming the photoresist (not illustrated) by the fifth photolithography process, Ti and Au are evaporated again to form a film, of which thickness is 100 nm in total, by the electron beam evaporation method. Thereafter, the first drain electrode 501, the first source electrode 601, the second drain electrode 502 and the second source electrode 602 are formed by the lift-off method. At this time, the first source electrode 601 and the second drain electrode 502 are integrally formed as in FIG. 8 and electrically connected with each other. In addition, the first source electrode 601 is connected with the first gate electrode 201 by simultaneously forming an interlayer wiring (not illustrated) via the above-mentioned contact hole together with the source-drain electrodes.

According to the above, an E/D inverter, in which the first drain electrode 501 is regarded as an voltage supply node and the second source electrode 602 is regarded as an ground node, is completed. Note that the photolithography processes are executed five times.

In order to estimate the dynamic characteristics of the E/D inverter fabricated by the above-mentioned procedure, a circuit simulation of a 5-stage ring oscillator, which is composed of E/D inverters characterized in that the TFT having width of W=40 μm in the specimen 4 is set as a load TFT and the TFT having width of W=800 μm in the specimen 1 is set as a driver TFT, was performed.

Figure 16:
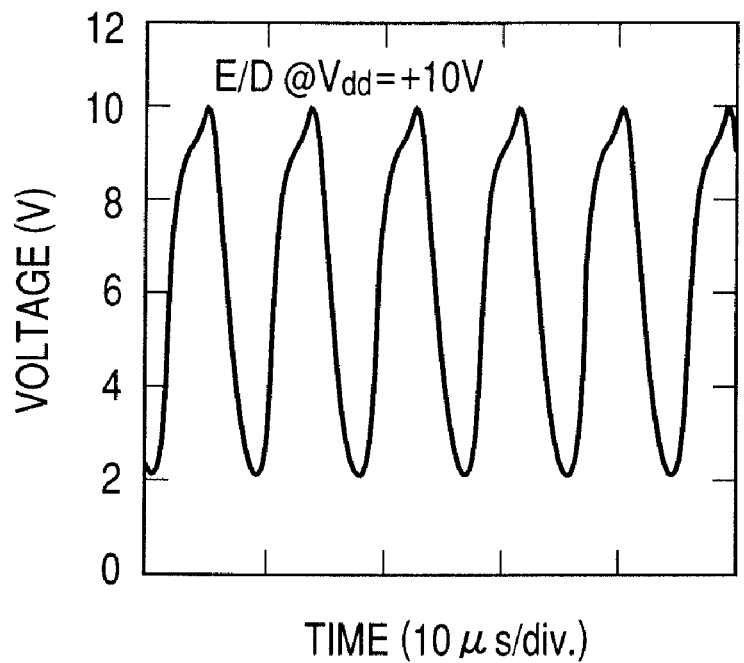
FIG. 16 is a view indicating an output simulation waveform of a ring oscillator composed of the E/D inverters in the Embodiment 4.

As a result, the 5-stage ring oscillator oscillated with 114 kHz at the external power supply voltage of +10 V. The delay time was 0.88 μs. The amplitude is 7.8 V, and a maximum value of the output voltage was +10 V, which is equal to the power supply voltage. An output waveform is indicated in FIG. 16.

In the present Embodiment 4, the E/D inverter can be simply structured with the same processing number of times of the photolithography process or by only increasing the photolithography process one time for the fabrication processes of the saturated load E/E inverters as indicated in the following comparative examples.

When providing the difference in film thickness, a film thickness adjustment may be performed by the lift-off method as indicated in the Embodiment 2 without performing the etching. In this case, the film thickness controllability is improved.

When providing the difference in the heating condition, the two kinds of TFTs may be fabricated by the different materials in the materials of structuring the source, drain and gate electrodes as indicated in the Embodiment 3, and the heating may be selectively performed by the induction heating or the optical irradiation.

COMPARATIVE EXAMPLE 4-1

Although the present fabrication method is similar to that in Embodiment 4, two kinds of TFTs are fabricated on the same substrate in a manner that the selective heating for the first channel layer 401 is not performed and the heating processes for the channels of the both TFTs are not performed. Then the saturated load E/E inverter can be fabricated.

Similar to the Embodiment 4 as indicated in FIG. 8, the first channel layer 401 and the second channel layer 402, to which the film thickness difference was provided by the etching or the lift-off method, are obtained. Then, the photoresist (not illustrated) is formed by the fifth photolithography process. Thereafter, Ti and Au are evaporated again to form a film, of which thickness is 100 nm in total, by the electron beam evaporation method, and the first drain electrode 501, the first source electrode 601, the second drain electrode 502 and the second source electrode 602 are formed by the lift-off method.

For the above-mentioned electrodes, the first gate electrode 201 is connected with the first drain electrode 501 by an external wiring (not illustrated) but is not connected with the first source electrode 601. In this manner, the saturated load E/E inverter, in which the first drain electrode 501 is regarded as an voltage supply node and the second source electrode 602 is regarded as an ground node, can be completed. Note that the photolithography processes are executed five times.

Figure 17:
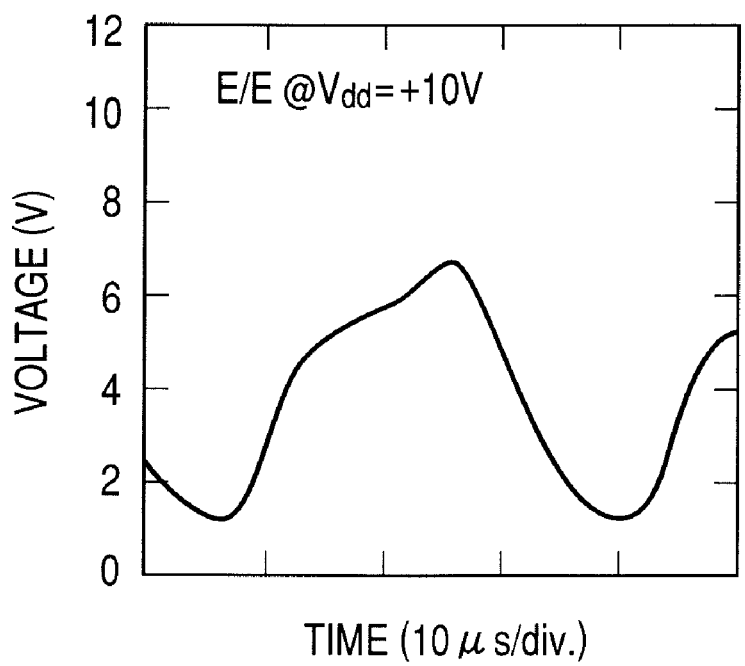
FIG. 17 is a view indicating an output simulation waveform of a ring oscill ator composed of the saturated load E/E inverters in the comparative example 4-1.

In order to estimate the dynamic characteristics of the saturated load E/E inverter fabricated by the above-mentioned procedure, the following circuit simulation was performed. That is, a circuit simulation of a 5-stage ring oscillator, which is composed of saturated load E/E inverters characterized in that the TFT having width of W=40 μm in the specimen 3 is set as a load TFT and the TFT having width of W=800 μm in the specimen 1 is set as a driver TFT, was performed. An output waveform is indicated in FIG. 17. The 5-stage ring oscillator oscillated with 30 kHz at the external power supply voltage of +10 V. The delay time per one stage is 3.4 μs, which was extended 3.8 times for the Embodiment 4. The amplitude is 5.6 V, and a maximum value of the output voltage is +6.8 V, which decreased about +3.2 V for the power supply voltage of +10 V. That is, as compared with the saturated load E/E inverter fabricated in this Comparative Example 4-1, the E/D inverter in the Embodiment 4 operates at a higher speed with larger amplitude than the saturated load E/E inverter fabricated in this Comparative Example 4-1.

Therefore, according to the fabrication method in the Embodiment 4, it can be expected that an inverter more excellent than that in this Comparative Example 4-1 can be obtained.

COMPARATIVE EXAMPLE 4-2

Although the present fabrication method is similar to that in Embodiment 4, two kinds of TFTs are fabricated on the same substrate in a manner that a process for adjusting the both channels to have different thickness is not performed but only the heating condition is changed with a state that the channels of the both TFTs have the same thickness of 30 nm. Then the saturated load E/E inverter can be fabricated.

The related fabrication process is indicated in FIG. 10.

The cleaned glass substrate (Corning Corporation product 1737) is employed as the substrate 100.

After forming the photoresist (not illustrated) on this glass substrate by the first photolithography process, Ti and Au are evaporated 50 nm in total by the electron beam evaporation method and then the patterning is performed by the lift-off method, thereby obtaining the first gate electrode 201 and the second gate electrode 202.

Next, the $SiO_2$ layer to become the gate insulator layer 300, which is common to the first TFT and the second TFT, is formed (deposition gas: Ar, deposition pressure: 0.1 Pa, applied electric power: 400 W, film thickness: 100 nm) on an entire surface by the RF magnetron sputtering method. After forming the photoresist (not illustrated) on this formed film by the second photolithography process, the gate insulator layer 300 is patterned by the etching, and a contact hole (not illustrated) is obtained on upper portions of the regions of the gate electrodes 201 and 202.

Subsequently, the amorphous IGZO film 400 is formed (deposition gas: $O_2$ (3.3 VOL %)+Ar, deposition pressure: 0.53 Pa, applied electric power: 300 W) as the channel layer 400 by the RF magnetron sputtering method. A film, of which thickness is 30 nm, is formed on both portions corresponding to the respective channel layers of the first TFT and the second TFT. The substrate temperature is not specially controlled in the course of the deposition by the sputtering method.

After forming the photoresist (not illustrated) by the third photolithography process, the channel layer 400 is etched, and the first channel layer 401 and the second channel layer 402 are obtained.

Subsequently, only the vicinity of the second channel layer 402 is locally (selectively/intensively) heated by the focused laser beam.

At last, after forming the photoresist (not illustrated) by the fourth photolithography process, Ti and Au are evaporated again to form a film, of which thickness is 100 nm in total, by the electron beam evaporation method. Thereafter, the first drain electrode 501, the first source electrode 601, the second drain electrode 502 and the second source electrode 602 are formed by the lift-off method. At the same time, the first drain electrode 501 is connected with the first gate electrode 201 by forming an interlayer wiring (not illustrated) via the above-mentioned contact hole.

Note that the first source electrode 601 and the second drain electrode 502 are integrally formed.

According to the above, the saturated load E/E inverter, in which the first drain electrode 501 is regarded as an voltage supply node and the second source electrode 602 is regarded as an ground node, is completed. The photolithography processes are executed five times.

Figure 18:
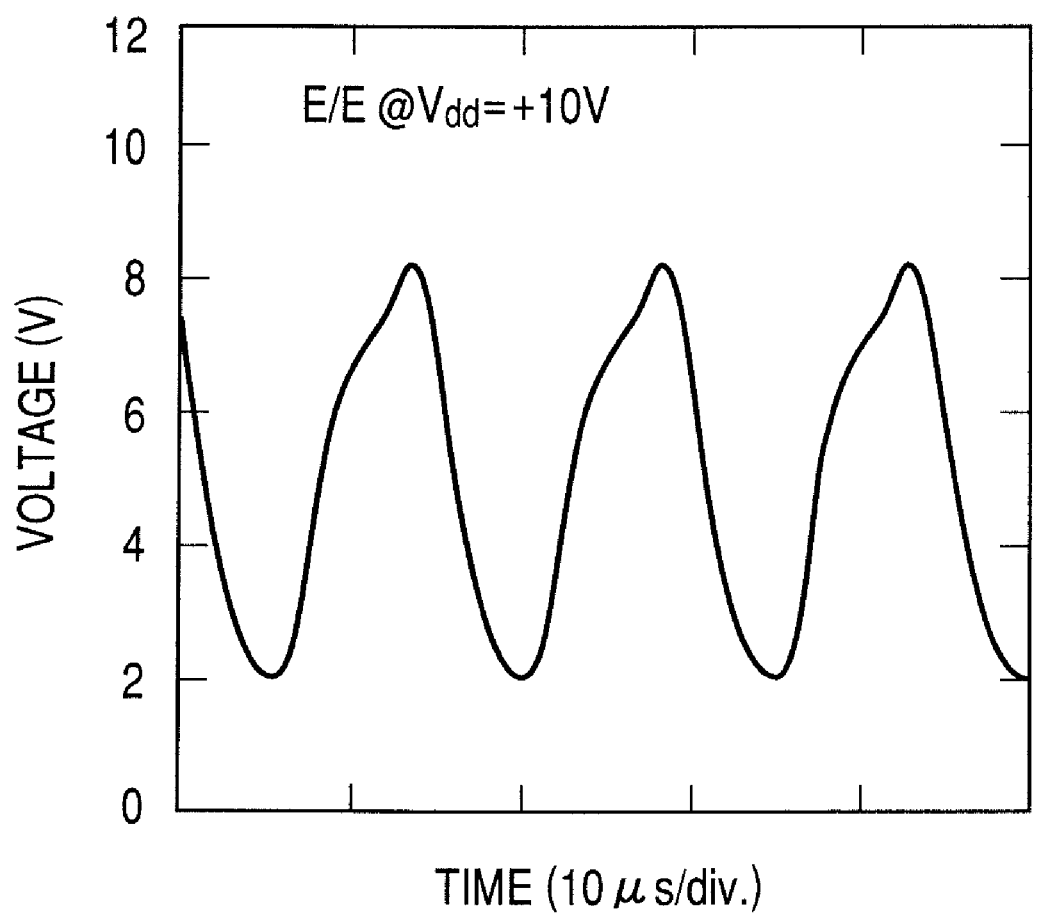
FIG. 18 is a view indicating an output simulation waveform of a ring oscillator composed of the saturated load E/E inverters in the comparative example 4-2.

In order to estimate the dynamic characteristics of the saturated load E/E inverter fabricated by the above-mentioned procedure, the following circuit simulation was performed. That is, a circuit simulation of a 5-stage ring oscillator, which is composed of saturated load E/E inverters characterized in that the TFT having width of W=40 μm in the specimen 2 is set as a load TFT and the TFT having width of W=800 μm in the specimen 1 is set as a driver TFT, was performed. An output waveform is indicated in FIG. 18. The 5-stage ring oscillator oscillated with 68 kHz at the external power supply voltage of +10 V. The delay time per one stage was 1.48 μs, which was extended seventy percent as compared with the Embodiment 4. The amplitude is 6.3 V, and a maximum value of the output voltage is +8.3 V, which decreased about 1.7 V for the power supply voltage of +10 V. That is, as compared with the saturated load E/E inverter fabricated in the present Comparative Example 4-2, the E/D inverter in the Embodiment 4 operates at a higher speed with larger amplitude than the saturated load E/E inverter fabricated in the present Comparative Example 4-2. Therefore, according to the fabrication method in the Embodiment 4, it can be expected that an inverter more excellent than that in the comparative example 4-2 can be obtained.

<Embodiment 5>

An inverter composed of oxide TFTs fabricated in the Embodiments 1 to 4 can be applied to an arbitrary circuit device in a digital circuit. For instance, it can be utilized in a NAND (Not AND) circuit, a NOR (Not OR) circuit, a ring oscillator, a clocked inverter, a flip-flop circuit, a shift register, an SRAM (Static RAM), a NOR-type ROM and a NAND-type ROM.

The present invention can be also applied to the fabrication of not only digital circuits but also analog circuits intentionally utilizing TFTs having different threshold voltage values. For instance, the present invention can be applied to an input stage of a differential amplifier.

In addition, the present invention can be applied to an arbitrary circuit using the above-mentioned circuit device including an inverter. For instance, the present invention can be applied to an active matrix display and a RFID (Radio Frequency Identification) tag.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-133039, filed May 18, 2007, which is hereby incorporated by reference herein in its entirety.

The invention claimed is:

1. A method of manufacturing an enhancement-depletion (E/D) inverter, the method comprising the steps of:
    forming a first transistor and a second transistor over a substrate, the first transistor and the second transistor each comprising a channel layer comprising an oxide semiconductor including at least one element selected from In, Ga and Zn, and thicknesses of the channel layers of the first and second transistors being different from each other; and
    performing heat treatment on at least one of the channel layers of the first and second transistors,
    wherein the first transistor and the second transistor are included in the enhancement-depletion inverter.

2. A method according to claim 1, wherein, in said step of performing heat treatment, the heat treatment is executed by applying more heat to either one of the channel layer of the first transistor and the channel layer of the second transistor.

3. A method according to claim 1, wherein said step of performing heat treatment includes the step of locally heating a partial region of the channel layer by contact heating or by irradiation with electromagnetic waves.

4. A method according to claim 1, wherein the inverter is formed such that the inverter has at least one of
    a construction in which a constituent material of a source electrode of the first transistor and a constituent material of a source electrode of the second transistor are different from each other,
    a construction in which a constituent material of a drain electrode of the first transistor and a constituent material of a drain electrode of the second transistor are different from each other, and
    a construction in which a constituent material of a gate electrode of the first transistor and a constituent material of a gate electrode of the second transistor are different from each other, and
    said step of performing heat treatment includes the step of heating the channel layer by irradiation of electromagnetic waves.

5. A method according to claim 4, wherein the inverter has at least one kind of
    a construction in which a property of the constituent material of the source electrode of the first transistor and a property of the constituent material of the source electrode of the second transistor are different from each other,
    a construction in which a property of the constituent material of the drain electrode of the first transistor and a property of the constituent material of the drain electrode of the second transistor are different from each other, and
    a construction in which a property of the constituent material of the gate electrode of the first transistor and a property of the constituent material of the gate electrode of the second transistor are different from each other, and
    the property is at least one selected from resistivity, specific heat and absorption coefficient.

6. A method according to claim 1, further comprising the step of executing etching of the channel layers in order to make the thicknesses of the channel layers of the first and second transistors different from each other.

7. A method according to claim 1, wherein, in order to make the thicknesses of the channel layers of the first and second transistors different from each other, the number of time(s) of performing said step of depositing the channel layer of the first transistor is made different from the number of time(s) of performing said step of depositing the channel layer of the second transistor.

8. A method of manufacturing an enhancement-depletion (E/D) inverter, the method comprising the steps of:
    forming a common deposition film over a substrate, acting as the channel layer of a first transistor and the channel layer of a second transistor, the channel layer of the first transistor and the channel layer of the second transistor each comprising an oxide semiconductor including at least one element selected from In, Ga and Zn; and
    performing heat treatment by applying a larger heating value to either one of the channel layer of the first transistor and the channel layer of the second transistor,
    wherein the first transistor and the second transistor are included in the enhancement-depletion inverter.

9. A method according to claim 8, wherein said step of performing heat treatment includes the step of locally heating a partial region of the channel layer by contact heating or by irradiation with electromagnetic waves.

10. A method according to claim 8, wherein the inverter has at least one of
- a construction in which a constituent material of a source electrode of the first transistor and a constituent material of a source electrode of the second transistor are different from each other,
- a construction in which a constituent material of a drain electrode of the first transistor and a constituent material of a drain electrode of the second transistor are different from each other, and
- a construction in which a constituent material of a gate electrode of the first transistor and a constituent material of a gate electrode of the second transistor are different from each other, and
- said step of performing heat treatment includes the step of heating the channel layer by irradiation with electromagnetic waves.

11. A method according to claim 10, wherein the inverter has at least one of
- a construction in which a property of the constituent material of the source electrode of the first transistor and a property of the constituent material of the source electrode of the second transistor are different from each other,
- a construction in which a property of the constituent material of the drain electrode of the first transistor and a property of the constituent material of the drain electrode of the second transistor are different from each other, and
- a construction in which a property of the constituent material of the gate electrode of the first transistor and a property of the constituent material of the gate electrode of the second transistor are different from each other, and
- the property is at least one selected from resistivity, specific heat and absorption coefficient.

12. An enhancement-depletion inverter comprising a first oxide semiconductor thin film transistor and a second oxide semiconductor thin film transistor which are formed over a substrate, wherein each of the first oxide semiconductor thin film transistor and the second oxide semiconductor transistor includes at least one element selected from In, Ga and Zn,
- wherein thicknesses of channel layers of the first oxide semiconductor transistor and the second oxide semiconductor transistor are different from each other,
- wherein threshold voltages of the first oxide semiconductor transistor and the second oxide semiconductor transistor are different from each other, and
- wherein said first and second oxide semiconductor transistors are structured to operate as at least part of said enhancement-depletion inverter.

13. The enhancement-depletion inverter according to claim 12, wherein said enhancement-depletion inverter is constructed to operate if a power supply voltage which satisfies a condition that a difference between the threshold voltages of the two transistors is 70% or more and 200% or less of the power supply voltage is supplied.

14. The enhancement-depletion inverter according to claim 12, wherein the enhancement-depletion inverter has at least one of:
- a construction in which a constituent material of a source electrode of the first oxide semiconductor transistor and a constituent material of a source electrode of the second oxide semiconductor transistor are different from each other;
- a construction in which a constituent material of a drain electrode of the first oxide semiconductor transistor and a constituent material of a drain electrode of the second oxide semiconductor transistor are different from each other; and
- a construction in which a constituent material of a gate electrode of the first oxide semiconductor transistor and a constituent material of a gate electrode of the second oxide semiconductor transistor are different from each other.

15. The enhancement-depletion inverter according to claim 12, wherein the inverter has at least one of:
- a construction in which a property of a constituent material of a source electrode of the first oxide semiconductor transistor and a property of a constituent material of a source electrode of the second oxide semiconductor transistor are different from each other,
- a construction in which a property of a constituent material of a drain electrode of the first oxide semiconductor transistor and a property of a constituent material of a drain electrode of the second oxide semiconductor transistor are different from each other, and
- a construction in which a property of a constituent material of a gate electrode of the first oxide semiconductor transistor and a property of a constituent material of a gate electrode of the second oxide semiconductor transistor are different from each other.

* * * * *